United States Patent [19]

Iwamatsu et al.

[11] Patent Number: 5,933,745
[45] Date of Patent: Aug. 3, 1999

[54] METHOD OF MAKING TOTAL DIELECTRIC SEMICONDUCTOR DEVICE ISOLATION REGION

[75] Inventors: Toshiaki Iwamatsu; Takashi Ipposhi, both of Tokyo, Japan

[73] Assignee: Mitsubishi Denki Kabushiki Kaisha, Tokyo, Japan

[21] Appl. No.: 08/947,339

[22] Filed: Oct. 8, 1997

Related U.S. Application Data

[62] Division of application No. 08/745,135, Nov. 7, 1996, Pat. No. 5,719,426.

[30] Foreign Application Priority Data

Apr. 26, 1996 [JP] Japan .................................. 8-107679

[51] Int. Cl.$^6$ ................................................ H01L 21/762
[52] U.S. Cl. ............................................ 438/404; 438/426
[58] Field of Search ................................... 438/404, 426, 438/448, FOR 222, FOR 229; 148/DIG. 85, DIG. 86

[56] References Cited

U.S. PATENT DOCUMENTS 5,039,621   8/1991   Pollack .
5,561,076   10/1996   Yoshino .

FOREIGN PATENT DOCUMENTS 63-300526   7/1988   Japan .

*Primary Examiner*—George R. Fourson
*Attorney, Agent, or Firm*—McDermott, Will & Emery

[57] ABSTRACT

A semiconductor integrated circuit is formed by MESA isolation of a thin film silicon layer, in which transistor characteristics are free from influence depending on pattern density of transistor forming regions. The thin film silicon layer on an insulating substrate is isolated by MESA isolation, and element forming regions are formed. In the middle part of a large distance between adjacent element forming regions, a LOCOS oxide film is thickly formed, and an oxide film is filled-in or buried between the LOCOS oxide film and the element forming regions contiguously at the same surface level so that there is no step-like level difference therebetween.

9 Claims, 22 Drawing Sheets

METHOD OF MAKING TOTAL DIELECTRIC SEMICONDUCTOR DEVICE ISOLATION REGION

This application is a division of application Ser. No. 08/745,135 filed Nov. 7, 1996 now U.S. Pat. No. 5,719,426.

TECHNICAL FIELD

The present invention relates to a semiconductor device, and more particularly, to the structure of a semiconductor device formed into a thin film semiconductor and a manufacturing process thereof.

BACKGROUND ART

A semiconductor integrated circuit having less floating capacity, obtains higher performance by isolating circuit elements with dielectric zones. In the case of forming transistors in a thin film silicon layer formed on an insulating film (hereinafter referred to as SOI layer), a so-called MESA isolation method is conventionally employed. In the MESA isolation method, the SOI layer between circuit elements are removed by is etching to isolate the circuits elements, and transistors are formed in each completely island-like semiconductor layer. The MESA isolation method has many advantages, including freedom from latch-up with adjacent transistors.

FIGS. 30 to 44 are schematic views of a conventional SOI MOSFET. Specifically, FIG. 30 is a plan view showing a structure of conventional SOI MOSFET. FIGS. 31 to 44 are schematic views showing a manufacturing process of the transistor, and in which FIGS. 31 to 37 are sectional views taken along the line 31–37 of FIG. 30, and show the steps of the manufacturing process. FIGS. 38 to 44 are sectional views taken along the line 38–40 of FIG. 30, and show the steps of the manufacturing process. FIG. 37 shows a sectional structure taken along the line 31–37 of a plan structure of FIG. 30, and FIG. 44 shows a sectional structure taken along the line 38–40 of FIG. 30.

The SOI MOSFET is isolated by the MESA isolation method, and as illustrated in the drawings, a silicon-buried oxide film 2 is formed on a silicon substrate 1 to serve as an insulating substrate. A thin film silicon semiconductor layer 3 is further formed thereon, and divided into element forming regions 4. A silicon oxide film 5 is filled-in or buried up to the same level as the element forming regions 4 so as to surround each region 4.

A FET is formed in each of the element forming regions 4, and the FET has a gate oxide film 7, a polysilicon layer 8 serving as a gate electrode, an insulating film 9 on the sides of the gate electrode, and a source/drain region 10. The gate electrode 8 is made of a polysilicon containing a phosphorus of not less than $1\times10^{20}/cm^3$ in concentration. The insulating film 9 surrounds the gate insulating film 7 and the gate 8. The semiconductor device further comprises an interlayer oxide film 11 and metal leads 12.

A manufacturing process of the SOI MOSFET is hereinafter described with reference to FIGS. 31 to 44. First, as illustrated in FIGS. 31 and 38, the surface of the SOI substrate 14 comprising the silicon substrate 1, buried oxide film 2 and SOI layer 3 are subject to oxidation up to 100 to 200 Å in film thickness, forming oxide film 15. Then, a resist 18 is formed, and part of the SOI layer 3 and overlapping oxide film 15 are removed by dry etching, whereby the element forming regions (active regions) 4 are formed. The isolation method called MESA isolation thus cuts electrical connection between adjacent transistors by removing part of the SOI. Then, channel doping is performed to establish a threshold voltage respectively for the NMOS FET and the PMOS FET, though not illustrated. A resist is formed only on the PMOS region, and boron ions of 1 to $6\times10^{12}/cm^2$ are implanted at 20 KeV into the NMOS region. This is the channel doping for the NMOSFET. Further, after removing the resist of the PMOS region, a resist is formed again only on the NMOS region, and phosphorus ions of 1 to $3\times10^{11}/cm^2$ are implanted at 30 KeV into the PMOS region. This is the channel doping for the PMOSFET.

Then, as illustrated in FIGS. 32 and 39, an oxide film 21 of 100 to 500 nm is deposited by chemical vapor deposition (CVD). Subsequently, as illustrated in FIGS. 33 and 40, the deposited oxide film 21 is etched (etching back) with strong anisotropy. As illustrated in these drawings, the oxide film 5 is left in different shapes depending on the space or distance between element forming regions 4 (transistor forming regions). As a result, transistor characteristics of each transistor are not always uniform, but different depending on the pattern of the transistor forming regions 4. More specifically, if the distance between the adjacent transistor forming regions 4 is large, the oxide film 5 is shaped like a spacer. On the other hand, if the distance between the adjacent transistor forming regions 4 is small, the oxide film 5 is in a buried or filled form.

Then, as illustrated in FIGS. 34 and 41, a gate insulating film 7 and a polysilicon 8 are formed. The gate insulating film 7 is 100 Å in thickness, and the polysilicon (poly-Si) 8 contains phosphorus of not less than $1\times10^{20}/cm^3$ in concentration, and is 2000 Å in film thickness.

After forming the polysilicon 8 into a pattern of gate electrode leads, a resist is formed only on the PMOS region, and phosphorus ions of 1 to $3\times10^{13}/cm^2$ are implanted at 40 KeV into the NMOS region, though not illustrated. This is the LDD doping for the NMOS FET. Next, a resist is formed only on the NMOS region, and boron ions of 1 to $3\times10^{13}/cm^2$ are implanted at 20 KeV into the PMOS region, though not illustrated. This is the LDD doping for the PMOS FET.

After removing the resist on the NMOS region, an insulating film 9 is formed only on the side surface of the gate electrode 8 through the step illustrated in FIGS. 35 and 42. In this process, an insulating film is first deposited and then etched with strong anisotropy, whereby the insulating film 9 may be left self-conformably only on the side surface of the gate electrode 8. Then, a resist is formed only on the PMOS region, and phosphorus ions of 4 to $6\times10^{13}/cm^2$ are implanted at 40 KeV into the NMOS region as illustrated in FIGS. 35 and 42. This is the source/drain doping for the NMOS FET. Next, a resist is formed only on the NMOS region, and boron ions of 4 to $6\times10^{13}/cm^2$ are implanted at 20 KeV into the PMOS region, though not illustrated. This is the source/drain doping for the PMOS FET.

Then, as illustrated in FIGS. 36 and 43, the interlayer insulating film 11 of 7000 Å in thickness is formed. A resist 18a is further applied thereon, in which contact holes are formed to communicate to the gate electrode 8 and source/drain 10. Subsequently, as illustrated in FIGS. 37 and 44, a metal layer mainly composed of aluminum is formed by sputtering, and aluminum leads 12 are patterned. Thus, a SOI MOSFET is formed.

In the step illustrated above in FIGS. 33 and 40 of the conventional manufacturing process, it is certain that desirable transistor characteristics are obtained, when the oxide film 5 is filled between two adjacent transistor forming regions 4. When the oxide film 5 is shaped like a spacer, there is a disadvantage of a hump occurring in the subthreshold characteristic, resulting in an increase in leakage current.

FIG. 45 is a schematic view for explaining the cause of such a disadvantage. The spacers 5 are over-etched by etching back the oxide film 11, and the spacers 5 are further etched by wet treatment for removing the oxide film prior to the gate formation, whereby an upper corner portion (parasitic MOS) of each SOI element forming region 4 becomes exposed. As a result, the gate electric field is concentrated at the corner portions, and the threshold voltage is lowered, eventually resulting in occurrence of hump in the subthreshold characteristic.

Notwithstanding, the etching back of the oxide film 11 performed in the steps illustrated in FIGS. 32 to 33 and FIGS. 39 to 40 is an essential process. Without the etching back, the characteristics will deteriorate.

FIGS. 46 to 48 are schematic views explaining the mentioned disadvantages. That is, after etching the SOI layer 3 using the resist mask 18 as illustrated in FIG. 46, the resist 18 is removed as illustrated in FIG. 47. Then, at the time of removing the oxide film 15 on the transistor forming region 4 by wet treatment, the buried oxide film 2 is also etched. In the gate forming steps performed later, the gate 8 wraps around the lower corner portions of the transistor forming region 4 as illustrated in FIG. 48. The gate electric field concentration also takes place at the lower corner portion of the transistor forming region 4 in addition to the mentioned disadvantage of the gate electric field concentration at the upper corner portion. As a result, problems arise such as lowering in threshold voltage at the lower corner portion, deterioration in subthreshold characteristic, and increase in drain leak current.

Another conventional manufacturing process is hereinafter described. FIGS. 49 to 51 show a process using chemical mechanical polishing (CMP) in order to prevent oxide films on the edge of the element forming regions from being unevenly shaped depending on pattern density, i.e., whether or not patterns of the element forming regions (active regions) are dense on an SOI substrate. After etching an SOI layer 3 using a resist mask 18 as illustrated in FIG. 49, an oxide film 21 is deposited as illustrated in FIG. 50, and is polished by CMP. In this manner, the SOI layer 3 is utilized as a stopper layer to moderate a surface level difference. Nevertheless, a so-called dishing effect may take place on the oxide film 21 depending on pattern density as illustrated in FIG. 51. Accordingly, oxide film thickness is inevitably reduced at the middle portion of the area where there is a large distance between adjacent transistor forming regions 4, which brings about a level difference and increase in gate capacity. Thus, transistor characteristic is not improved in this conventional manufacturing process, either.

A further conventional manufacturing process is hereinafter described. FIGS. 52 to 55 show a process for providing a dummy pattern on the SOI layer 3 in order to prevent reduction in thickness of the oxide film due to the mentioned dishing. As illustrated in FIG. 52, the SOI layer 3 and the dummy layer 23 (polysilicon or nitride film) are etched using a resist mask, and the oxide film 21 is deposited thereon. Then, as illustrated in FIG. 53, using the dummy layer 23 as an etching stopper, the oxide film 21 is etched by CMP. The dummy layer is then removed as illustrated in FIG. 54. Further, part of the thick oxide film 5 near the edge of the SOI layer 3 is etched by wet treatment as illustrated in FIG. 55, thereby the level difference between the SOI layer 3 and the oxide film 5 is moderated. If any sharp step-like level difference still remains, gates may not be formed by patterning. Then, a gate 8 is formed by patterning. However, the disadvantage of dishing is not overcome by this conventional process.

A further conventional manufacturing process is hereinafter described. FIGS. 56 to 58 show a process in which a dummy pattern of the field oxide is preliminarily provided in the region where dishing may take place. In this process, as illustrated in FIG. 56, a dummy region 24 is provided in addition to the required element forming regions 4 to prevent the mentioned dishing. It is certain that dishing due to CMP may be prevented by this process, but the dummy pattern 24 of the SOI layer 3 still remains after forming the gate oxide film 7 and the gate 8 as illustrated in FIG. 58. As a result, gate capacity is undesirably increased by the existence of such dummy patterns of the SOI layer, and it becomes difficult to obtain a circuit comprised of a SOI MOSFET with low power consumption and high operation speed.

A further conventional manufacturing process is hereinafter described. FIGS. 59 to 61 show a process in which a dummy pattern of the oxide film is provided in a region between adjacent transistor regions in order to solve the same problems as in the foregoing conventional processes. As illustrated in FIG. 59, a resist 18c is formed by an additional mask to form a dummy pattern after etching the SOI layer 3. As illustrated in FIG. 60, the dummy pattern 26 is formed by etching the oxide film 25 deposited on the SOI layer 3 using the mentioned resist 18c as a mask. Then, an oxide film 21 is deposited, and as shown in FIG. 61, surface level difference is moderated by CMP. In this process, it is certain that the problems of dishing and gate capacity increase are solved, but the additional mask 18c must be used to form the dummy pattern 26. Moreover, the mask for dummy patterns may be displaced on the patterned SOI layer 3.

As discussed above, in manufacturing an SOI MOSFET, the MESA isolation process has been developed to eliminate negative effects of parasitic transistor. However, in any of the conventional manufacturing processes, a serious problem exists in that manufacturing of a transistor of desirable characteristics is difficult. Difficulty arises because of surface level difference caused by dishing, and because of an increase in gate capacity which is influenced by pattern density in the transistor forming regions.

DISCLOSURE OF THE INVENTION

The present invention was made to solve the above problems and provides an SOI semiconductor device of low leak current in the source/drain, and a manufacturing process thereof, and in particular, an object of providing a SOI MOSFET integrated circuit and a manufacturing process thereof. The invention also intends to provide a manufacturing process of the SOI MOSFET integrated circuit which is free from influence by pattern density of the transistor forming regions, without an increase in gate capacity and without any sharp surface level difference due to dishing.

According to one aspect of the present invention, a semiconductor device comprises a plurality of isolated element forming regions of thin film semiconductor formed on an insulating film. A first insulating film is formed contiguously to the element forming regions in substantially the same thickness as the element forming regions. A second insulating film is formed contiguously to the first insulating film between the element forming regions in a thickness larger than the thickness of the element forming regions.

In another aspect of the present invention, in the semiconductor device, the element forming regions of thin film semiconductor is formed of silicon, and the first and second insulating films are respectively formed of a silicon oxide film.

In another aspect of the present invention, the element forming regions of thin film semiconductor are formed of silicon, the first insulating film is formed of a silicon nitride film, and the second insulating film is formed of a silicon oxide film.

In another aspect of the present invention, the entire surface of the element forming regions are oxidized to be coated with an oxide film.

In another aspect of the present invention, an impurity is doped into side surfaces of the element forming regions to form portions of high impurity concentration.

In another aspect of the present invention, the width of the first insulating film is established as not being larger than the minimum distance between the element forming regions.

According to another aspect of the present invention, the semiconductor device is comprised of a memory cell section and a peripheral circuit section. In the peripheral circuit section, a plurality of isolated element forming regions of thin film semiconductor are formed on an insulating film. A first insulating film is formed contiguously to the element forming regions in substantially the same thickness as the element forming regions. A second insulating film is formed contiguously to the first insulating film and between the element forming regions in a thickness larger than that of the element forming regions.

According to another aspect of the present invention, in a manufacturing process of a semiconductor device, a polycrystalline semi-conductor layer is formed on a semiconductor layer which is formed in turn on an insulating film, and a nitride film is further formed on the polycrystalline semiconductor layer. A resist is applied to the nitride film, the nitride film and the polycrystalline semiconductor layer are patterned, and side surface of the patterned polycrystalline semiconductor layer is coated with a nitride film. The semiconductor layer exposed by the patterning is oxidized to form an oxide film. The nitride film applied to the side surface of the polycrystalline semiconductor layer is removed, and the exposed semiconductor layer is removed by etching for patterning the semiconductor layer. An insulating film is buried between the patterned semiconductor layer and the oxide film.

In another aspect of the present invention, in the manufacturing process of the semiconductor device, the nitride film, applied to the upper surface of the polycrystalline semiconductor layer, is removed while the nitride film, applied to the side surface of the polycrystalline semiconductor layer, is removed. The polycrystalline semiconductor layer is removed by etching while the exposed semiconductor layer is etched.

In another aspect of the present invention, in the manufacturing process of the semiconductor device, the surface of the patterned semiconductor layer is preliminarily oxidized to form an oxide film prior to burying an insulating film between the patterned semiconductor layer and the oxide film.

In another aspect of the present invention, in the manufacturing process of a semiconductor device, a polycrystalline semiconductor layer is formed on a semiconductor layer which is in turn formed on an insulating film, and a nitride film is further formed on the polycrystalline semiconductor layer. A resist is applied to the nitride film, the nitride film and the polycrystalline semiconductor layer are patterned, and the side surface of the patterned polycrystalline semiconductor layer is coated with a nitride film. The semiconductor layer exposed by the patterning is oxidized to form an oxide film. The nitride film applied to the side and upper surfaces of the polycrystalline semiconductor layer is removed, and the exposed semiconductor layer is removed by etching using the polycrystalline semiconductor layer as a mask for patterning the semiconductor layer. An insulating film is buried between the patterned semiconductor layer plus polycrystalline semiconductor layer and the oxide film.

In another aspect of the present invention, in the manufacturing process of the semiconductor device, an impurity is preliminarily doped into the side surface of the patterned semiconductor layer prior to burying an insulating film between the patterned semiconductor layer plus polycrystalline semiconductor layer and the oxide film.

In another aspect of the present invention, in the manufacturing process of the semiconductor device, a silicon semiconductor layer is used as the semiconductor layer, a polysilicon layer is used as the polycrystalline semiconductor layer, and either a silicon oxide film or a silicon nitride film is used as the insulating film.

In another aspect of the present invention, in the manufacturing process of the semiconductor device, the thickness of the nitride film coating the side surface of the patterned polycrystalline semiconductor layer is established as not being larger than ½ the distance between the transistor forming regions.

Other objects, features, and advantages of the invention will become apparent in the course of the following description of the preferred embodiments with reference to the accompanying drawings.

BRIEF DESCRIPTION OF THE DRAWINGS

In the drawings which form a part of the present application.

BEST MODE FOR CARRYING OUT THE INVENTION

The preferred embodiments of the present invention are hereinafter described in detail with reference to the accompanying drawings.

The First Embodiment

Figure 1:
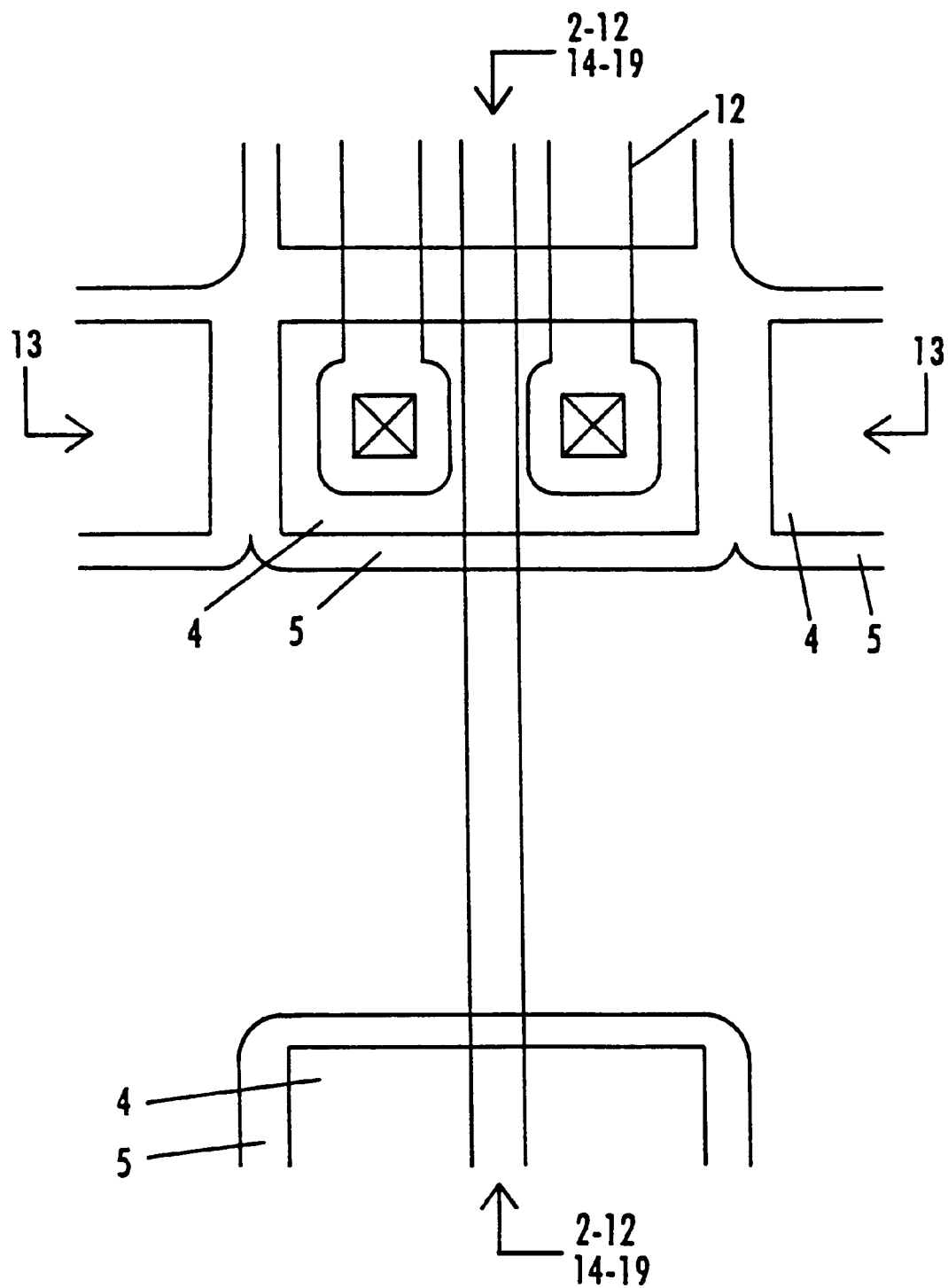
FIG. 1 is a plan view showing a structure of a semiconductor device (SOI/MOSFET) according to a first embodiment of the present invention.

FIGS. 1 to 13 are schematic views to explain a structure of an SOI semiconductor device and a manufacturing process according to the first embodiment of the present invention. FIG. 1 is a plan view illustrating a structure of an SOI MOSFET of this embodiment, FIGS. 2 to 12 are sectional views taken along the line 2–12 of FIG. 1 to show a series of manufacturing steps of the transistor, and FIG. 13 is a sectional view of the structure taken along the line 13—13 of FIG. 1.

Figure 12:
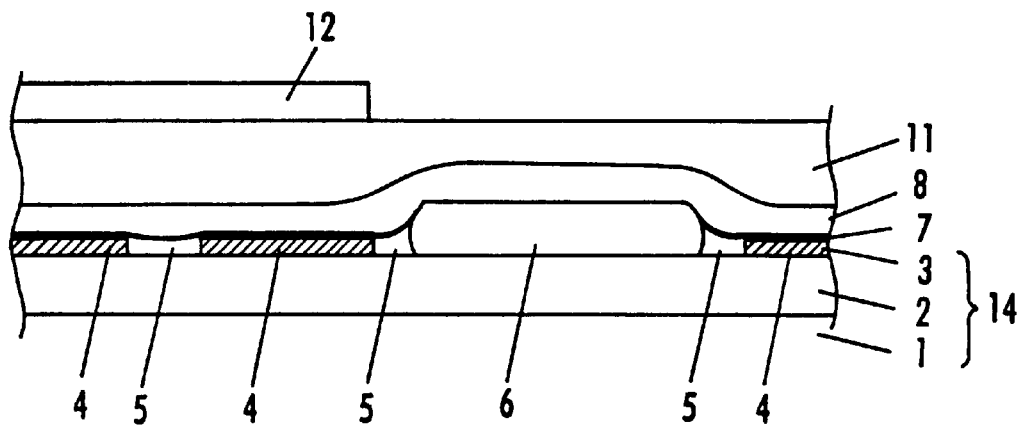
Figure 13:
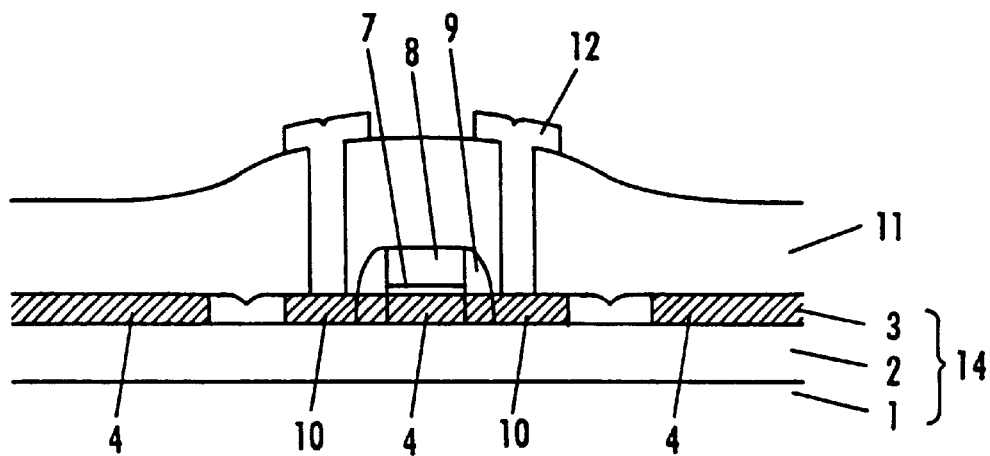

The SOI MOSFET is isolated by the MESA isolation method, and as illustrated in the drawings, particularly in FIGS. 1, 12 and 13, a silicon buried oxide film 2 (insulating film) is formed on a silicon substrate 1 to serve as an insulating substrate, and the element forming regions 4 are formed thereon from a thin film silicon semiconductor layer 3, isolated from each other. A silicon oxide film 5 (first insulating film) is buried surrounding the element forming regions 4 at the same height as the element forming regions 4. In the area where the distance between adjacent element forming regions 4 is small, only the oxide film 5 is buried or filled, while in the area where the distance between the adjacent element forming regions 4 is large, an isolating silicon oxide film 6 (second insulating film) is formed therebetween. The isolating silicon oxide film 6 is thicker and higher than the element forming regions 4. It should be noted that the buried oxide film 5 is formed in such a manner as to become gradually higher from the level of the element forming regions 4 up to the level of the isolating oxide film 6, thereby connecting the surfaces smoothly and gently without any step-like level difference.

A FET is formed in each element forming region 4, and the FET has a gate insulating film 7, a polysilicon layer 8 serving as a gate electrode, an insulating film 9 on the side surface of the gate electrode, and a source/drain region 10. The gate electrode 8 is made of a polysilicon containing phosphorus of not less than $1 \times 10^{20}/cm^3$ in concentration. The insulating film 9 surrounds the gate insulating film 7 and the gate 8. The semiconductor device of this embodiment further comprises an interlayer oxide film 11 and metal leads 12.

The semiconductor device of this first embodiment has substantially no step-like level difference between the SOI layer, serving as element forming regions 4, and the buried oxide film 5. Further, polysilicon is not left at the time of patterning the gate, and therefore, there is no short-circuiting of the gate. Furthermore, since the isolating oxide film 6 may be thickened, parasitic capacity such as lead capacity may be reduced, and the semiconductor device thus obtained is applicable to any circuit of high speed, low power consumption and low voltage featured by the SOI type semiconductor device. In this manner, devices of uniform characteristics may be formed irrespective of pattern density in the element (transistor) forming regions.

Figure 2:
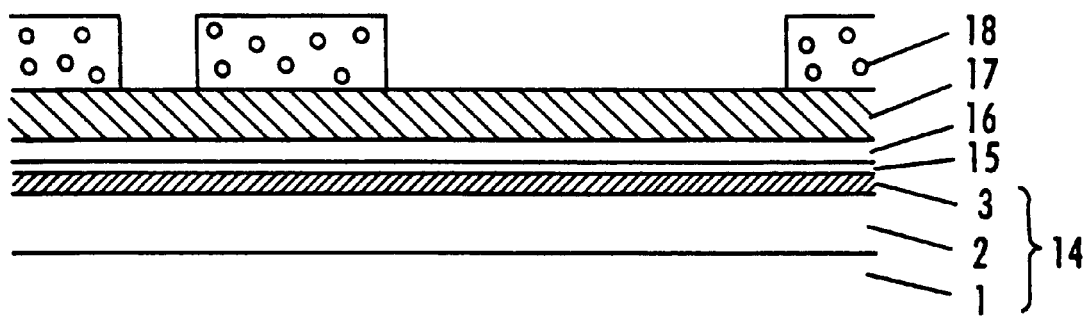
FIGS. 2–13 illustrate a manufacturing process of a semiconductor device (SOI/MOSFET) according to the first embodiment of the present invention, and show cross-sectional structures of the device in the process.

Described hereinafter is a manufacturing process of the semiconductor device according to the first embodiment of the present invention. First, as illustrated in FIG. 2, a SOI substrate 14 comprising the silicon substrate 1, buried oxide film 2 (insulating film) and SOI layer 3 (thin film semiconductor layer) is prepared. The SOI substrate 14 may be formed by SIMOX, joining up wafers, or by any other method. On this SOI substrate 14, an oxide film 15 is formed by CVD under the oxidizing condition of about 800° C. Alternatively, an oxide film 15 is formed by oxidizing the SOI layer 3 under the oxidizing condition of about 800° C. A polysilicon layer 16 (polycrystalline semi-conductor layer) of 1000 Å in thickness is formed on the oxide film 15, and a nitride film 17 of 1000 to 2000 Å in thickness is further formed thereon at about 700° C. Then, a resist 18 is patterned corresponding to the active regions (element forming regions).

Figure 3:
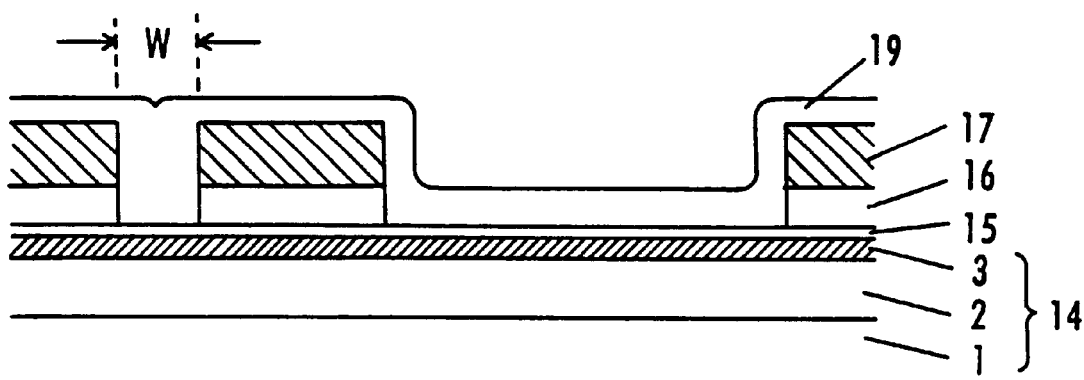
Figure 4:
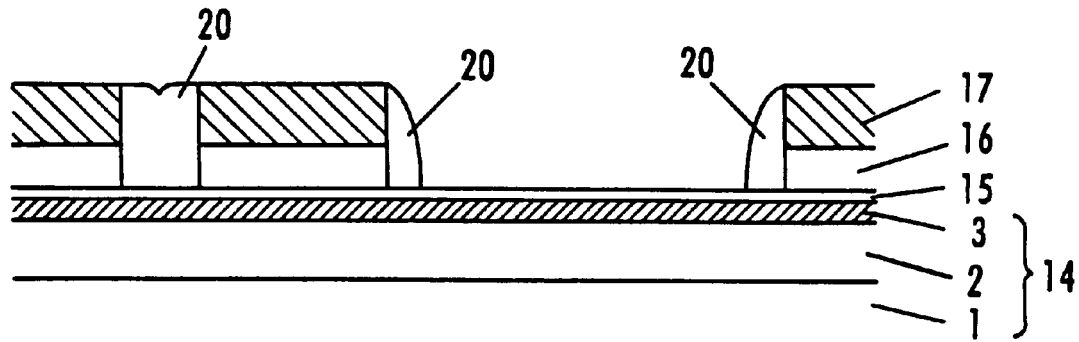
Figure 5:
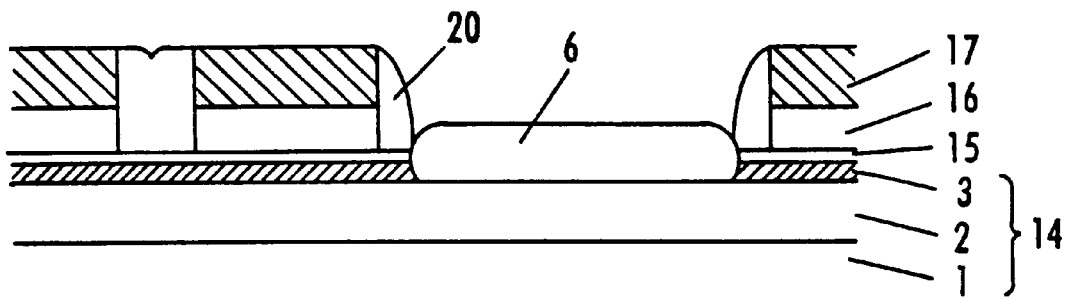

Then, the nitride film 17 and the polysilicon 16 are removed by dry etching using the resist 18 as a mask as illustrated in FIG. 3. Next, a nitride film 19 is deposited thereon to fill-in or bury the minimum isolation width W between the active regions. Then, as illustrated in FIG. 4, the deposited nitride film 19 is etched under the etching condition of strong anisotropy and left only on the side surface of the patterned nitride film 17 and the polysilicon 16 in the form of a spacer 20 (nitride film) The SOI layer 3 lying under the exposed oxide film 15 is then oxidized. As illustrated in FIG. 5, the oxide film 6 formed by oxidizing the SOI layer 3 reaches the buried oxide film 2. The growth rate of the oxide isolation film 6 is different depending on the size of the pattern, and growth in the region of small width is delayed. To accomplish this, it is preferable to establish a longer oxidizing time so that the SOI layer 3 in the region of small width may be completely oxidized. The SOI layer 3 of 1000 Å in film thickness is oxidized under the condition of forming an oxide film of 1200 to 2500 Å in film thickness.

Figure 6:
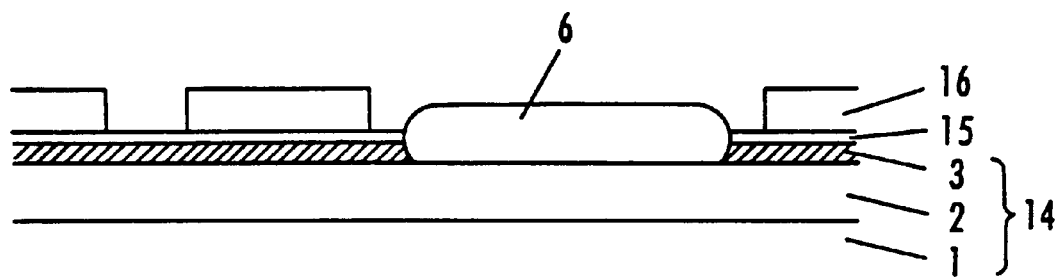
Figure 7:
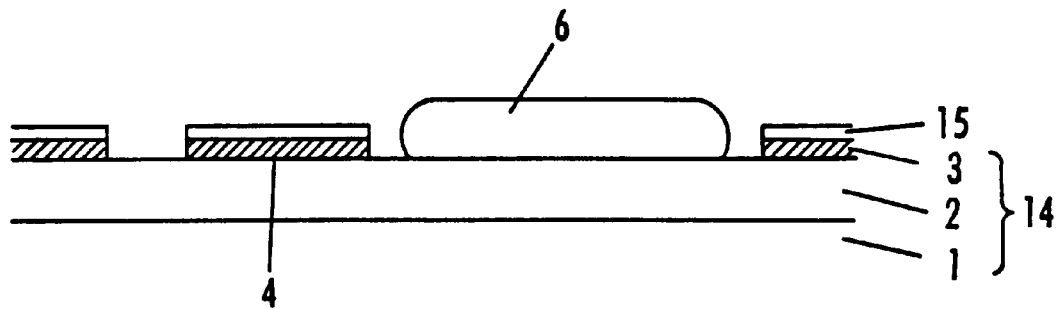

The nitride film 17 and the nitride sidewall spacer 20 are removed by wet treatment as illustrated in FIG. 6. Then, the polysilicon 16 on the oxide film 15 is removed by dry etching as illustrated in FIG. 7, whereby the exposed oxide film 15 and the SOI layer 3 lying thereunder are also removed. Thus, the SOI layer 3 is patterned. It is also possible to remove the oxide film 15 preliminarily by wet treatment and then dry etch the polysilicon 16.

Figure 8:
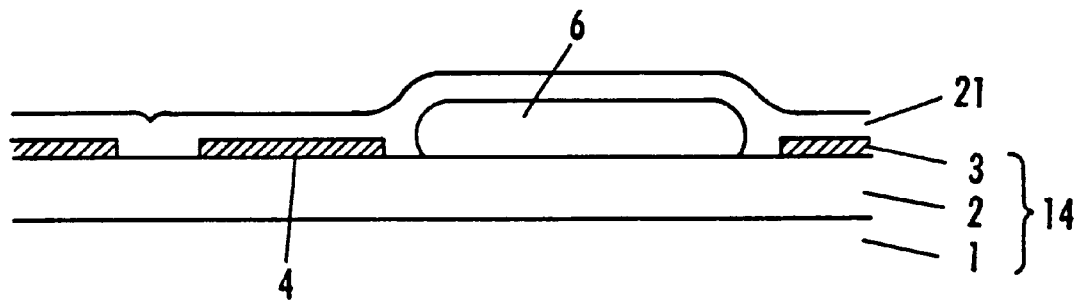
Figure 9:
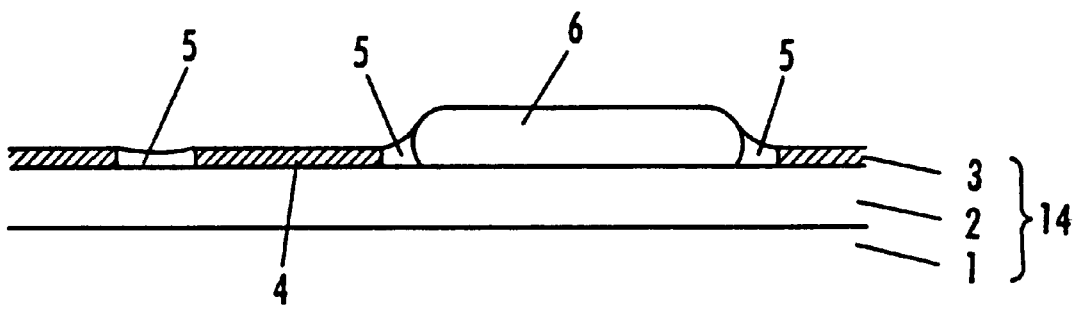

Then, as illustrated in FIG. 8, an oxide film 21 is deposited on the entire surface by CVD, and the deposited oxide film 21 is mostly removed by dry etching as illustrated in FIG. 9. By this process, the oxide film 5 (insulating film) may be filled-in or buried in the places where the SOI layer 3 has been removed by etching. It should be noted that there is no sharp level difference between the SOI layer 3 and the filled-in or buried oxide film 5 as illustrated in FIG. 9.

Figure 10:
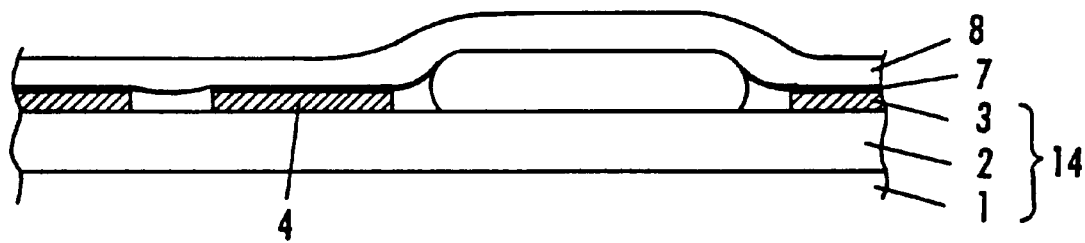
Figure 11:
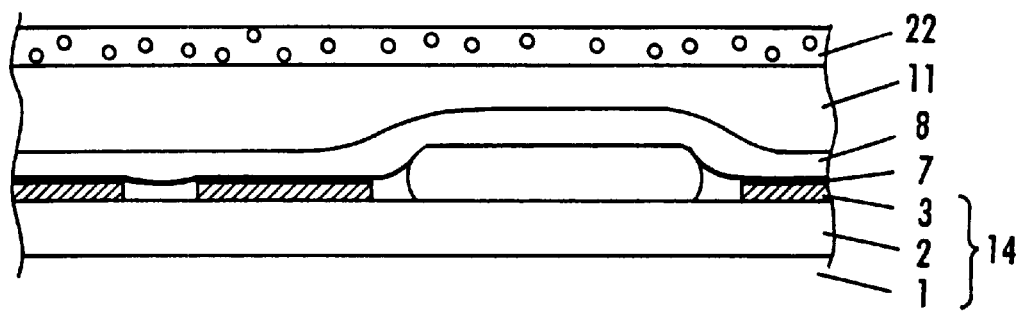

Then, channel doping is performed for a PMOS region and a NMOS region respectively, though not illustrated. Then, as illustrated in FIG. 10, a gate oxide film 7 is formed on the surface of the SOI layer 3, and a polysilicon gate 8 is deposited thereon. A LDD structure is formed by the known transistor process, and a source/drain is formed, though not illustrated. Next, an interlayer oxide film 11 and a resist 22 are applied as illustrated in FIG. 11, and the aluminum lead 12 is formed as illustrated in FIG. 13.

In the manufacturing process of the SOI MOSFET semiconductor device according to this embodiment, since there is substantially no step-like surface level difference between the SOI element forming regions 4 and the buried oxide film 5, polysilicon is not left at the time of patterning the gate. Therefore, there is no short-circuiting of the gate. Furthermore, since the isolating oxide film 6 may be thickened, parasitic capacity such as lead capacity may be reduced. The semiconductor device thus obtained is applicable to any circuit of high speed, low power consumption and low voltage featured by the SOI device. In this manner, devices of uniform characteristics may be formed irrespective of pattern density of the device (transistor) forming regions.

The Second Embodiment

Another manufacturing process of the SOI semiconductor device shown in FIGS. 1, 12 and 13 is provided by the second embodiment of the present invention, which is now described with reference to FIGS. 14 to 19. FIGS. 14 to 19 are sectional views taken along the line 14–19 of FIG. 1, and show the manufacturing process of the device.

Figure 14:
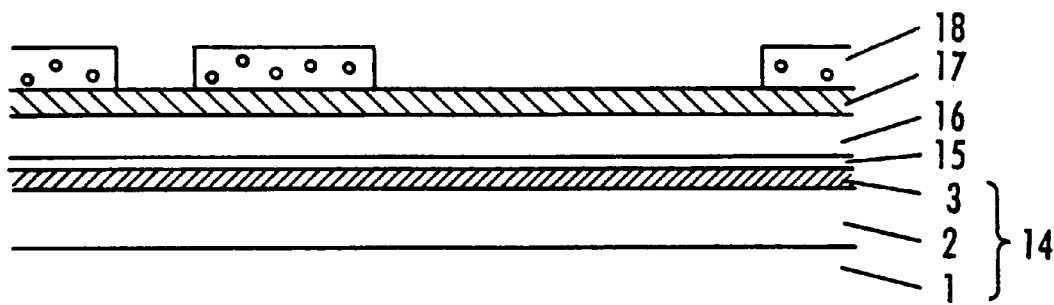
FIGS. 14–19 illustrate a manufacturing process of a semiconductor device (SOI/MOSFET) according to a second embodiment of the present invention, and show cross-sectional structures of the device in the process.

First, as illustrated in FIG. 14, a SOI substrate 14 comprised of a silicon substrate 1, buried oxide film 2 (insulating film) and SOI layer 3 (thin film semiconductor layer) is prepared. The SOI substrate 14 may be formed by SIMOX, by joining up wafers, or by any other method. As illustrated in FIG. 14, an oxide film 15 of 100 to 300 Å is formed by CVD method under the oxidizing condition of about 800° C., or the oxide film 15 is formed by oxidizing the SOI layer 3 under the oxidizing condition of about 800° C. Then, a polysilicon layer 16 (polycrystalline semiconductor layer) of 2000 Å in thickness is formed on the oxide film 15, and a nitride film 17 of 1000 to 2000 Å in thickness is further formed thereon at about 700° C. Then, a resist 18 is patterned corresponding to active regions (element forming regions).

Figure 15:
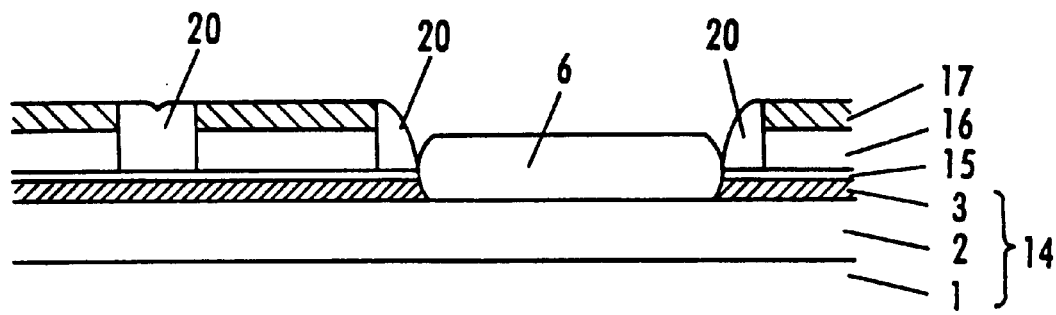

The nitride film 17 and the polysilicon 16 are then selectively removed by dry etching using the resist 18 as a mask. Next, a nitride film of adequate thickness is deposited on the entire surface to fill-in or bury a minimum isolation width between the active regions, though not illustrated. Then, the deposited nitride film is etched under the etching condition of strong anisotropy forming spacers 20 (nitride film), only on the side surfaces of the patterned nitride film 17 and the polysilicon 16, as illustrated in FIG. 15. The SOI layer 3 lying under the exposed portion of oxide film 15 is then oxidized as illustrated in FIG. 15. The oxide film 6 formed by oxidizing the SOI layer 3 reaches the buried oxide film 2.

The growth rate of the oxide film 6 is different depending on the size of the pattern, and growth in the region of small width is delayed. To accomplish this, it is preferable to establish a longer oxidizing time so that the SOI layer 3 in the region of small width may be completely oxidized. The SOI layer 3 of 1000 Å in film thickness is oxidized under the condition of forming an oxide film of 1200 to 2500 Å in thickness. The foregoing steps are substantially the same as the first embodiment, and therefore, the description is simplified.

Figure 16:
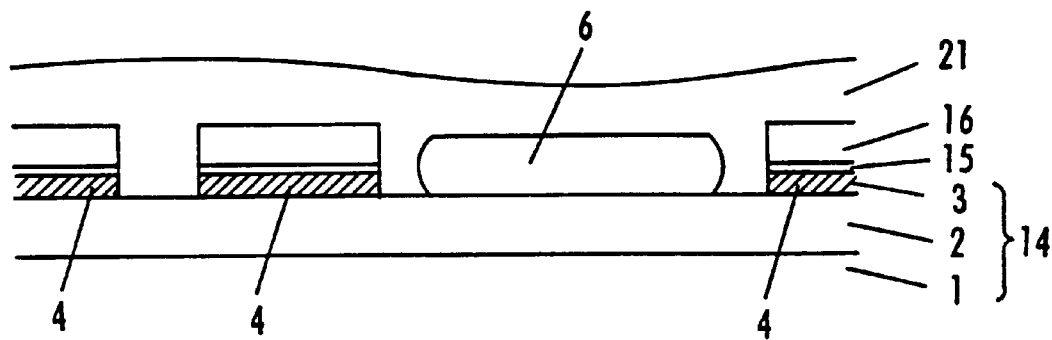
Figure 17:
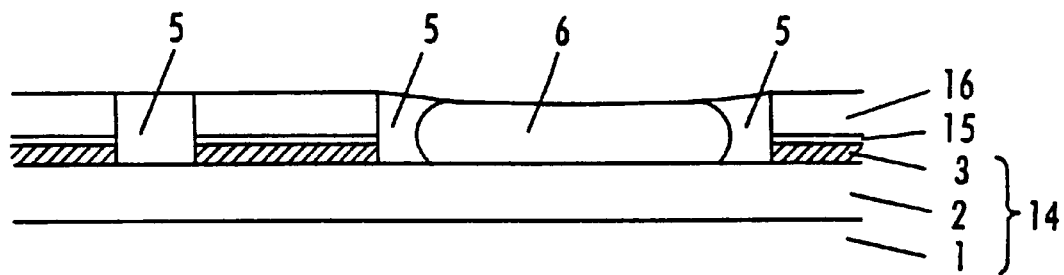
Figure 18:
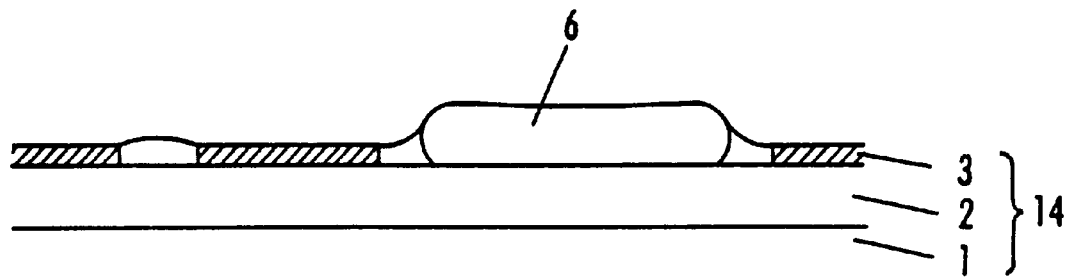

Next, the nitride film 17 and the nitride spacer 20 are etched by wet treatment as illustrated in FIG. 16. Then, using the polysilicon layer 16 as a mask, the portions of the oxide film 15 not coated with the polysilicon layer 16 and the SOI layer 3 lying thereunder are removed by dry etching, and the SOI layer 3 is patterned. Thus the element forming regions 4 are formed. At this time, the polysilicon layer 16 is also thinned to be about 1000 Å in thickness. Then, as illustrated in FIG. 16, an oxide film 21 is deposited by CVD on the entire surface, and the deposited oxide film 21 is mostly removed by dry etching as illustrated in FIG. 17. By this process, the oxide films 5 are left in the places where the SOI layer 3 has been removed by etching. Subsequently, as illustrated in FIG. 18, the polysilicon 16 is removed by isotropic plasma etching, and the filled-in or buried oxide film 5 and the oxide film 15 on the surface are smoothed by HF (hydrofluoric) treatment.

Figure 19:
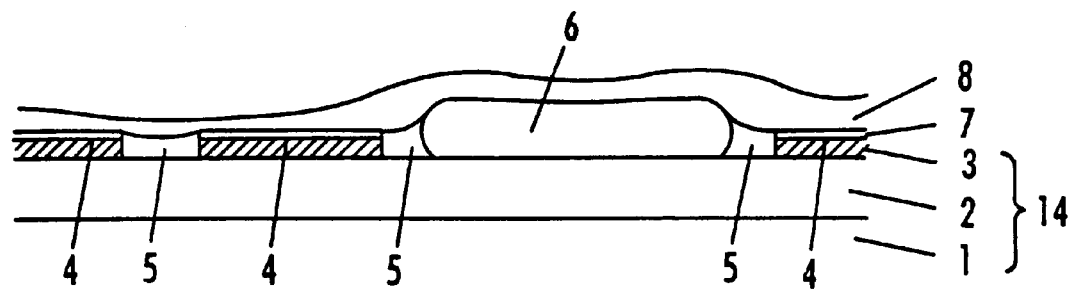

Then, channel doping is performed for a PMOS region and a NMOS region respectively, though not illustrated. Then, as illustrated in FIG. 19, a gate oxide film 7 is formed on the surface of the element forming regions 4, and a polysilicon gate 8 is deposited thereon. Thereafter, a LDD structure is formed by the known transistor process, a source/drain is formed, and the aluminum leads are formed, though not illustrated.

In the manufacturing process of the SOI MOSFET semiconductor device according to this embodiment, there is substantially no step-like level difference between the SOI element forming regions 4 and the filled-in buried oxide film 5. Accordingly, polysilicon is not left at the time of patterning the gate, and therefore, there is no short-circuiting of the gate. Furthermore, since the isolating oxide film 6 may be thickened, parasitic capacity such as lead capacity may be reduced. The semiconductor device thus obtained is applicable to any circuit of high speed, low power consumption and low voltage featured by the SOI device. In this manner, devices of uniform characteristics may be formed irrespective of pattern density of the device (transistor) forming regions.

The Third Embodiment

Figure 20:
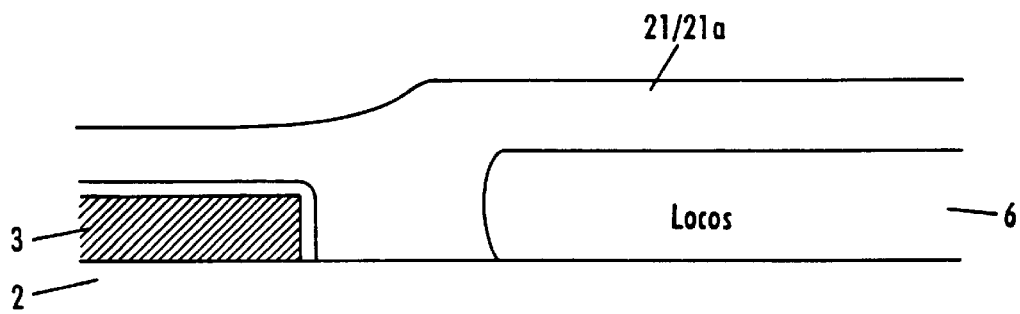
FIGS. 20–22 illustrate a manufacturing process of a semiconductor device (SOI/MOSFET) according to a third embodiment of the present invention, showing cross-sectional structures of the device in the process.
Figure 21:
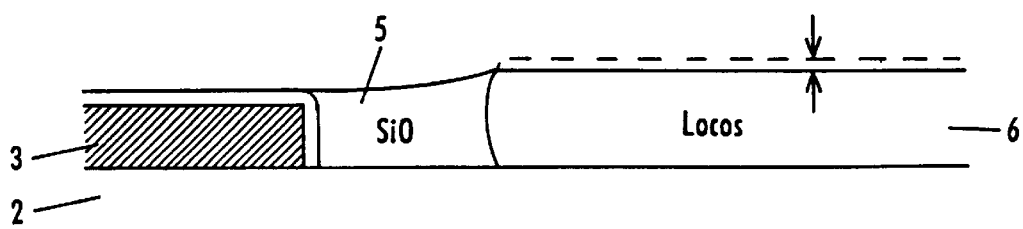
Figure 22:
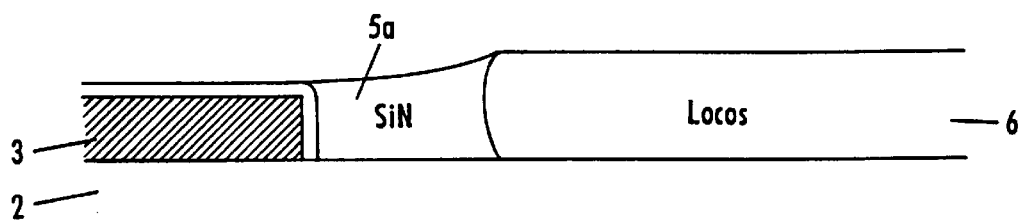

FIGS. 20 to 22 are schematic views explaining a manufacturing process according to the third embodiment of the present invention. In FIGS. 7 and 8 of the first embodiment, the process of filling-in or burying an oxide film 5 by CVD in the region where the SOI layer 3 has been etched is shown. According to the third embodiment, a nitride film is buried instead of the oxide film as described below.

FIG. 20 is equivalent to FIG. 8 of the first embodiment, and shows that either an oxide film 21 or a nitride film 21a is deposited by CVD on an SOI layer 3 and oxide isolation film 6. In case the oxide film 21 is used, the LOCOS oxide film 6 is also etched and the film thickness is reduced at the time of etching the oxide film 21 to form the filled-in or buried film 5 as illustrated in FIG. 21. This reduction in film thickness brings about an increase in capacity of the gate and the lead, resulting in deterioration in device characteristics. To accomplish this, the nitride film 21a is used. FIG. 22 shows a state in which the deposited nitride film 21a is etched, and the filled-in or buried nitride film 5a is left. In this manner, the reduction in film thickness of the LOCOS oxide film 6 may be prevented by employing the nitride film 21a. Deposition of the nitride film 21a may be performed by CVD, and etching may be performed either by dry etching under the condition of strong anisotropy or by CMP. It is also possible to combine wet etching with dry etching or CMP.

Likewise, the nitride film is applicable to the insulating film in the foregoing second embodiment to be filled-in or buried adjacent to the SOI layer 3 serving as the element forming regions, and the same advantage is obtained.

The Fourth Embodiment

Figure 23:
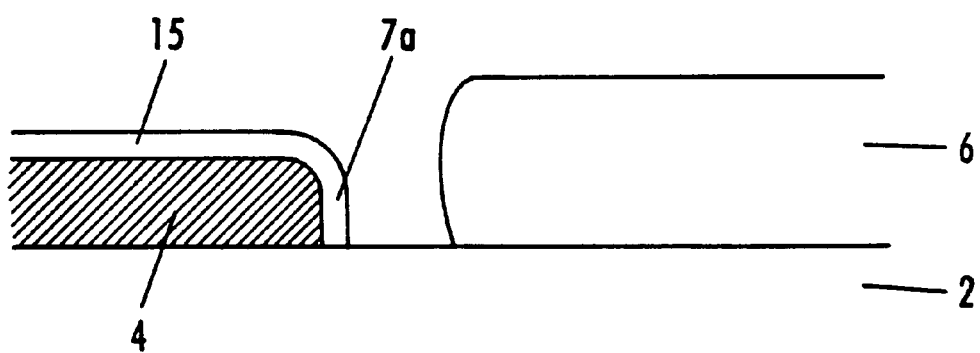
FIGS. 23–24 illustrate a manufacturing process of a semiconductor device (SOI/MOSFET) according to a fourth embodiment of the present invention, showing cross-sectional structures of the device in the process.
Figure 24:
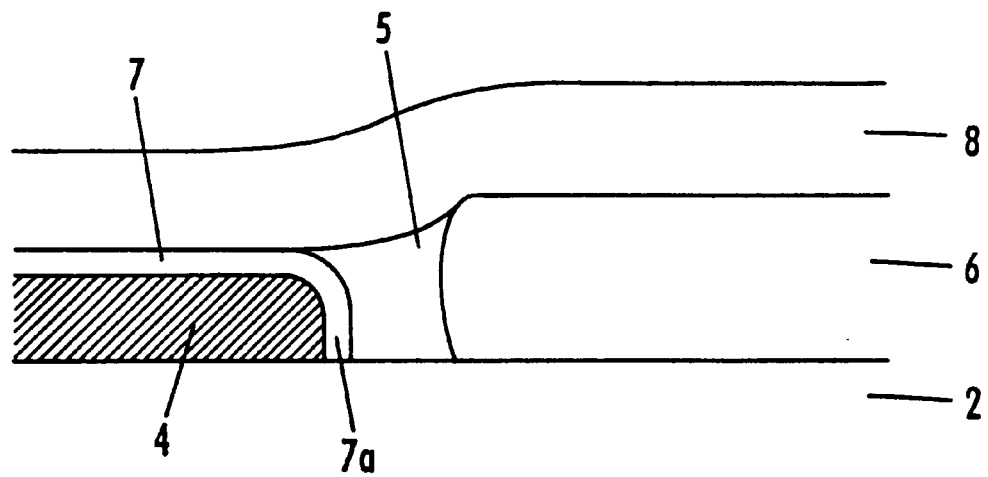

FIGS. 23 and 24 are schematic views to explain a manufacturing process according to the fourth embodiment of the present invention. With reference to FIG. 23, in the manufacturing process according to this fourth embodiment, the polysilicon 16 is etched as shown in FIG. 7 in the foregoing first embodiment, and then an oxide film 7a is formed on the SOI layer 3 by oxidizing the SOI layer 3. FIG. 23 shows a structure in which the entire surface of the left SOI layer 3, i.e. element forming regions 4, is coated with the oxide films 7a and 15. Coating occurs after dry etching part of the SOI layer 3 as shown in FIG. 7 in the first embodiment.

Then, in the same manner as shown in FIG. 8, the oxide film 21 is deposited on the entire surface by CVD, and the deposited oxide film 21 is removed by dry etching as illustrated in FIG. 24. By this step, the oxide film 5 is filled-in or buried in the place where the SOI layer 3 has been removed by etching. It should be noted that there is almost no step-like level difference between the SOI layer 3 and the buried oxide film 5 as illustrated in FIG. 24.

Then, channel doping is performed for a PMOS region and a NMOS region respectively, though not illustrated. Then, as illustrated in FIG. 24, a gate oxide film 7 is formed on the surface of the patterned SOI layer 3, i.e. element forming regions 4, and the polysilicon gate 8 is deposited thereon. Thereafter, a LDD structure is formed by the known transistor process, the source/drain is formed, and the aluminum leads are formed, though not illustrated.

In the manufacturing process as stated above, as illustrated in FIG. 24, the CVD oxide film 5 is not in direct contact with the SOI layer 3 owing to the oxide film 7a formed by oxidizing the SOI layer 3. Therefore yield of the devices is improved. Further, since there is substantially no step-like level difference between the SOI element forming regions 4 and the buried oxide film 5, polysilicon is not left at the time of patterning the gate 8, and therefore, there is no short-circuiting of the gate 8. Furthermore, since the oxide film 6 in the isolated regions may be thickened, parasitic capacity, such as lead capacity, may be reduced. Accordingly, the semiconductor device thus obtained is applicable to any circuit of high speed, low power consumption and low voltage featured by the SOI device. In this manner, devices of uniform characteristics may be formed irrespective of pattern density.

The Fifth Embodiment

Figure 25:
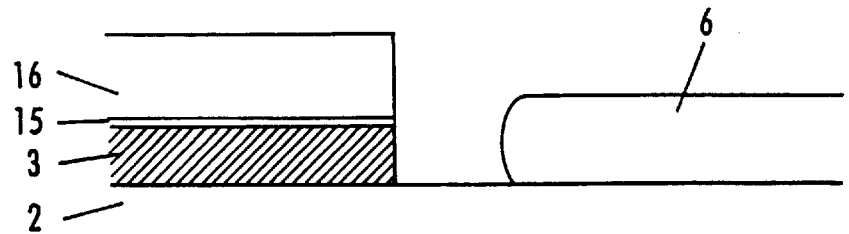
FIGS. 25–26 illustrate a manufacturing process of a semiconductor device (SOI/MOSFET) according to a fifth embodiment of the present invention, showing cross-sectional structures of the device in the process.
Figure 26:
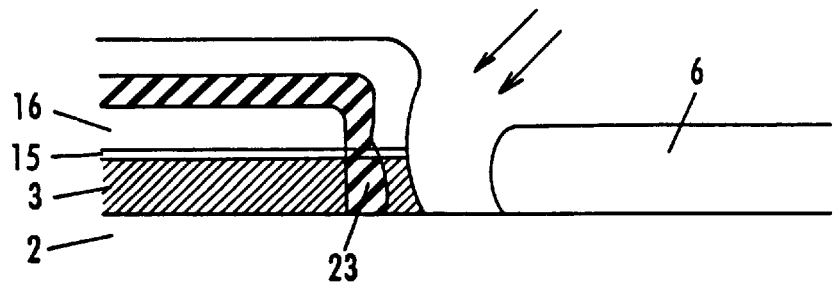

FIGS. 25 and 26 are sectional views showing the manufacturing process according to the fifth embodiment of the present invention. FIG. 25 shows a state before depositing the CVD oxide film 21 in the process shown in FIG. 16 of the foregoing second embodiment, and in which SOI layer 3, oxide film 15 and polysilicon film 16 are stacked and patterned. Then, the side surface of the SOI layer is oxidized, and doped with boron obliquely as indicated by the arrows in FIG. 26. Since the polysilicon 16 on the surface of the SOI layer 3 serves as a mask, the surface of the pre layer 3 is not entirely doped with boron. However, only the side surface of the SOI layer 3 may be heavily doped, forming a heavily doped region 23. The manufacturing process of the fifth embodiment is illustrated in FIGS. 25 and 26, and shows the method to implant boron into the edge of the NMOS. This method has an advantage of raising the threshold voltage of the parasitic transistor at the edge of the SOI layer 3. Thus, in the fifth embodiment of the invention, devices of uniform characteristic may be formed irrespective of pattern density.

The Sixth Embodiment

Figure 27:
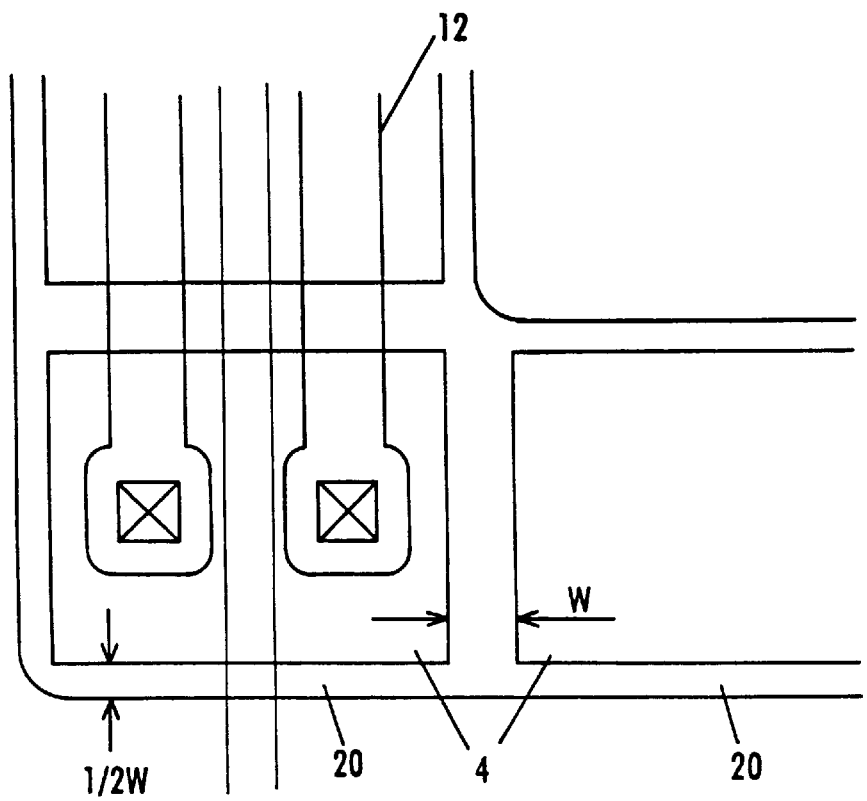
FIG. 27 illustrates a manufacturing process of a semiconductor device (SOI/MOSFET) according to a sixth embodiment of the present invention, showing plan view of the device in the process.

FIG. 27 is a plan view of a structure to explain the sixth embodiment of the present invention. In FIG. 27, the minimum isolation width between element forming regions 4 is identified as W. In this sixth embodiment, the thickness of the nitride film 19 at the time of deposition, and hence the thickness of the nitride film spacer 20, shown in FIG. 3 or 4 of the foregoing first embodiment, is established to be a half of the minimum isolation width W between the device regions illustrated in FIG. 27. As a result, the width of the SOI layer 3 removed by etching is ½W, when the distance between the element forming regions 4 is more than W. The width of the mod layer 3 removed by etching is in a width range from a half of the minimum isolation width W (W/2) to the minimum isolation width W. Thus, variation in width is not affected by pattern density, by which filling-in or burying and etching an oxide film are steadily carried out. Further, when establishing the thickness of the nitride film 19 (the width of the nitride film spacer 20), it should not be larger than the minimum isolation width W between the device regions. Variation in width of the SOI layer 3 removed by etching is not affected by pattern density of the element forming regions 4.

The Seventh Embodiment

Figure 28:
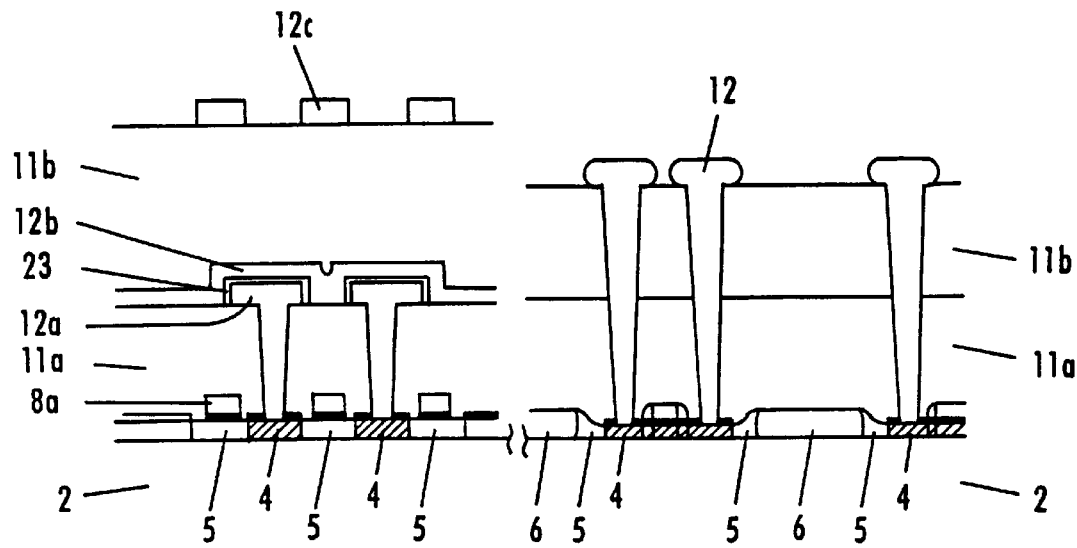
FIG. 28 is a cross-sectional view showing a structure of a semiconductor device (SOI/MOSFET DRAM) according to a seventh embodiment of the present invention.
Figure 29:
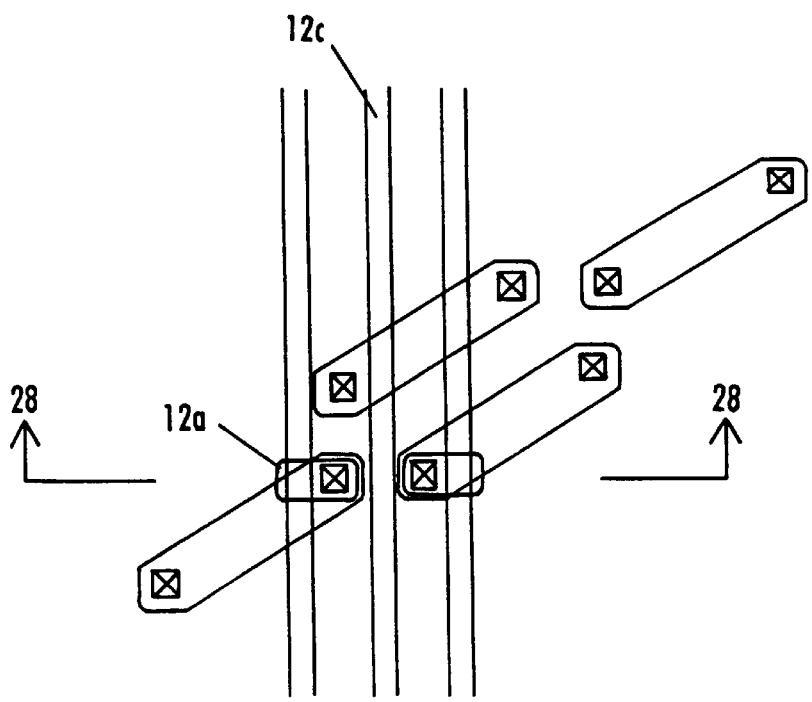
FIG. 29 is a plan view showing a structure of a semiconductor device (SOI/MOSFET DRAM) according to a seventh embodiment of the present invention.
Figure 30:
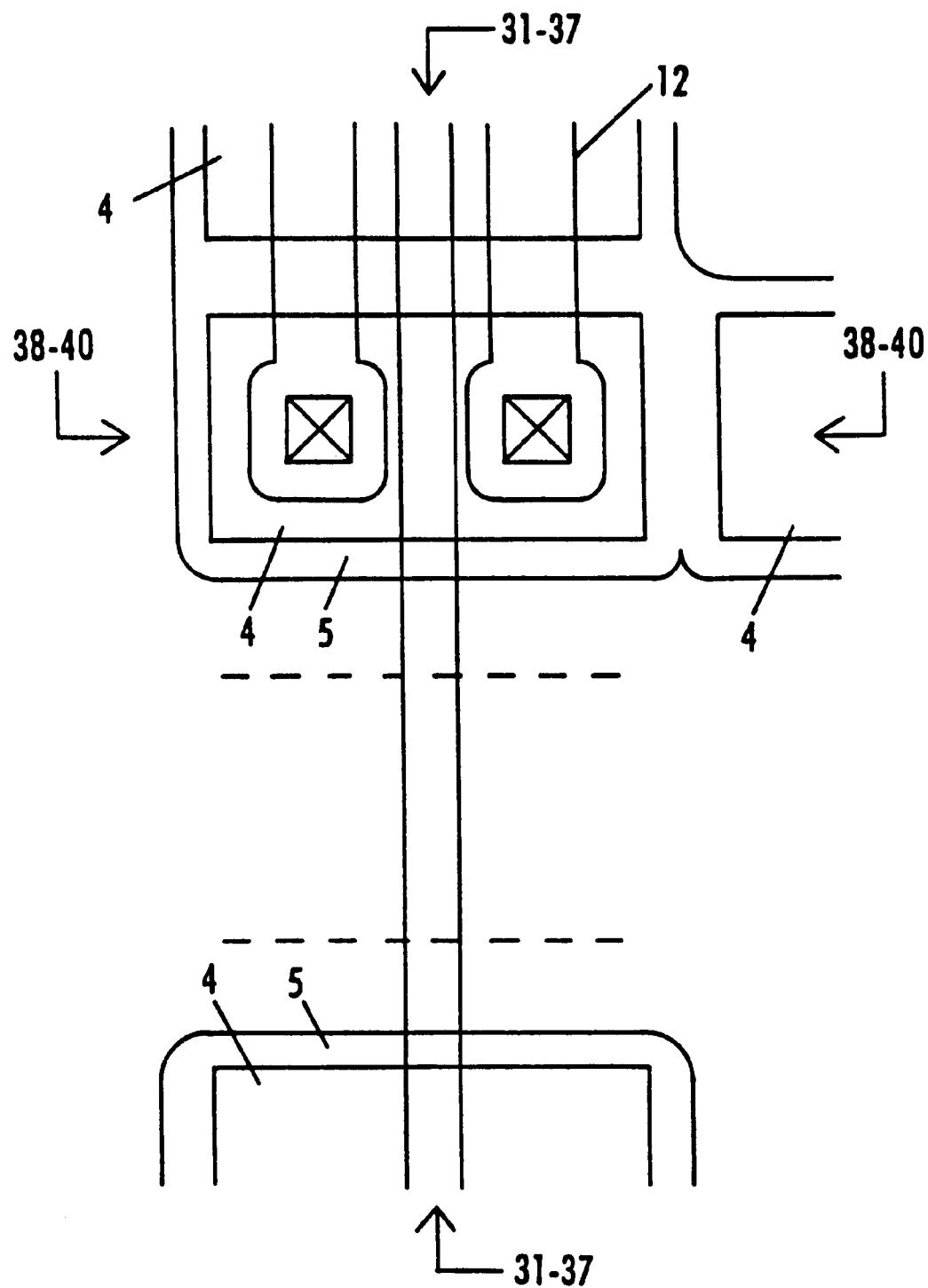
FIG. 30 is a plan view showing a structure of a conventional SOI MOSFET (the first example of the background art)
Figure 31:
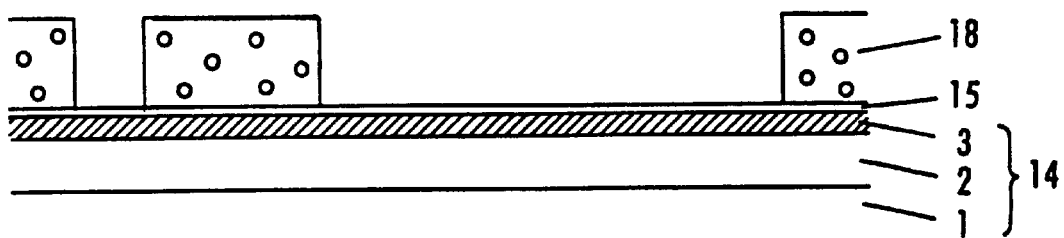
FIGS. 31–37 illustrate a manufacturing process of a conventional SOI MOSFET, showing cross-sectional structures of the device in the process taken along the line 31–37 of FIG. 30.
Figure 32:
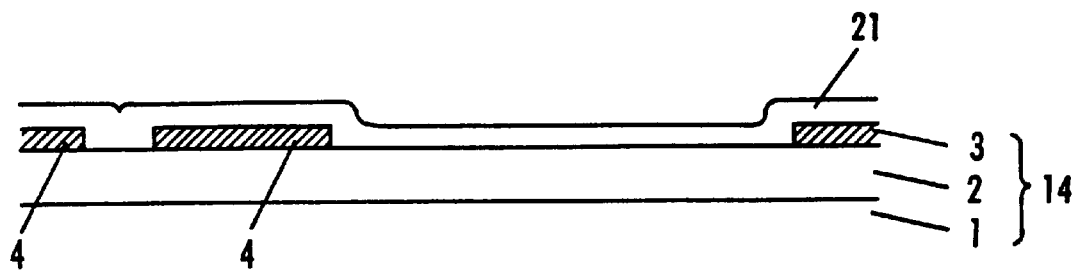
Figure 33:
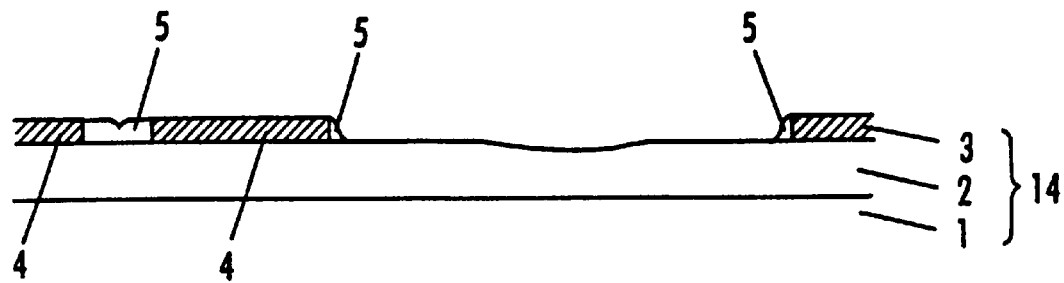
Figure 34:
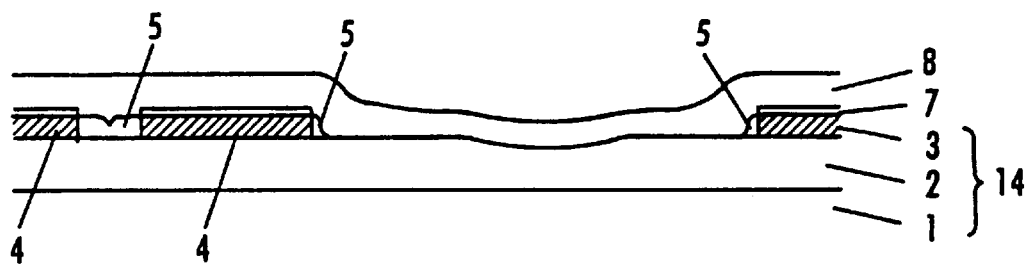
Figure 35:
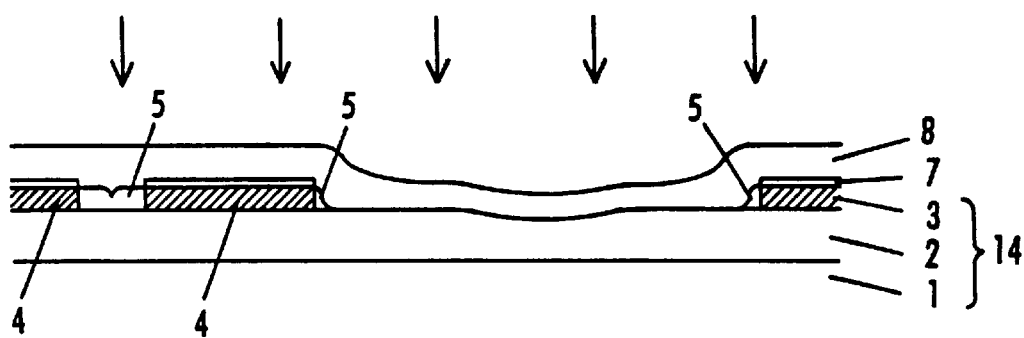
Figure 36:
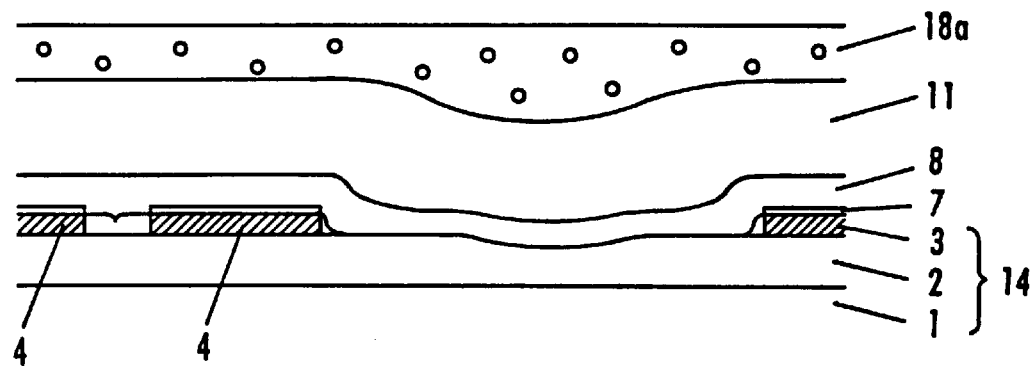
Figure 37:
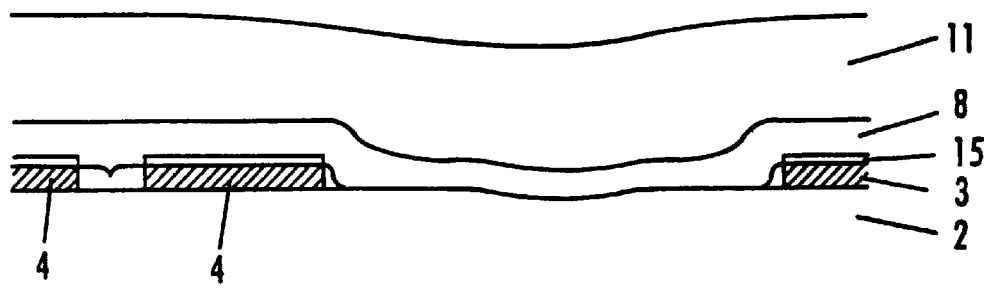
Figure 38:
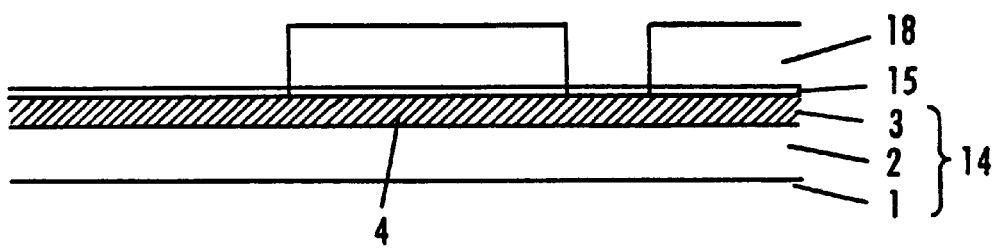
FIGS. 38–44 illustrate a manufacturing process of a conventional SOI MOSFET, showing cross-sectional structures of the device in the process taken along the line 38–40 of FIG. 30.
Figure 39:
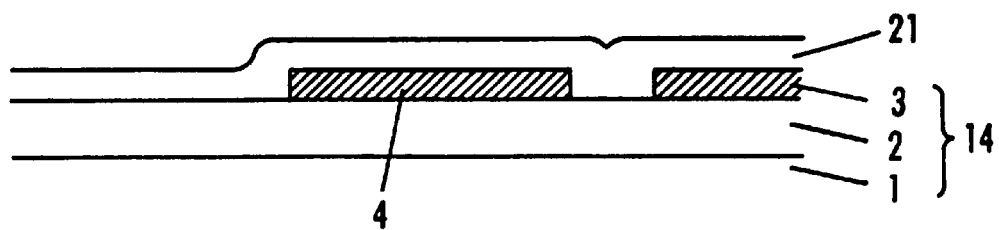
Figure 40:
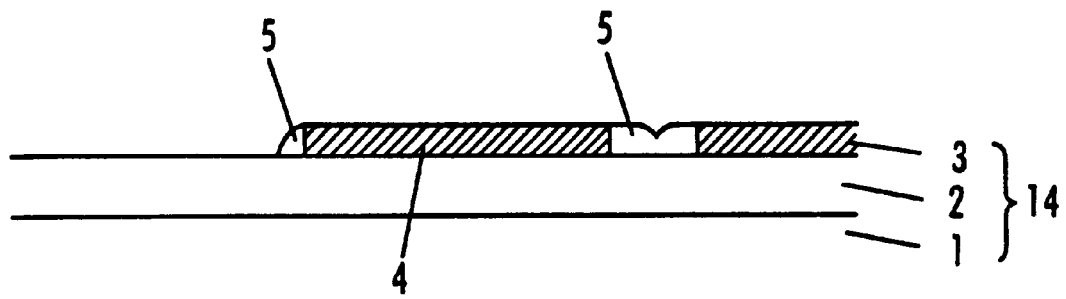
Figure 41:
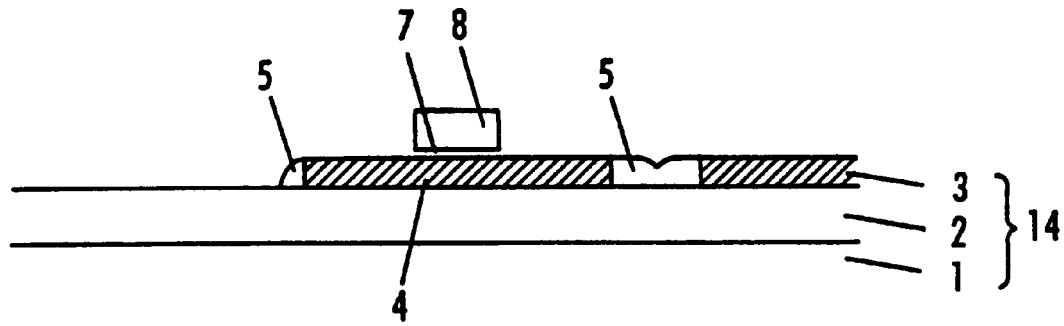
Figure 42:
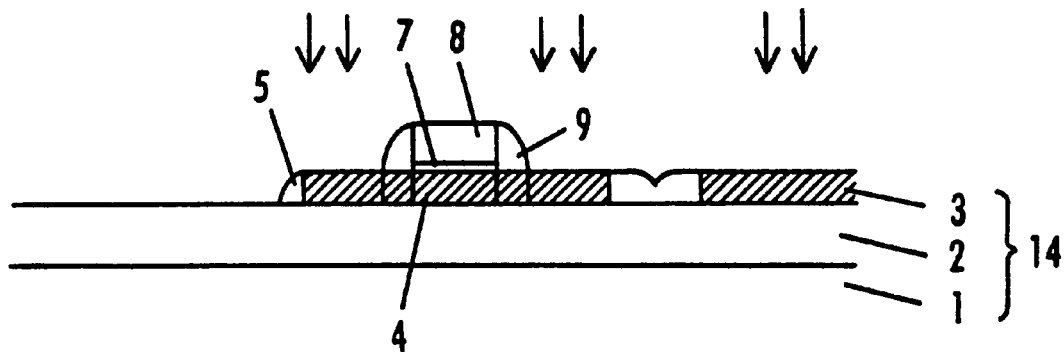
Figure 43:
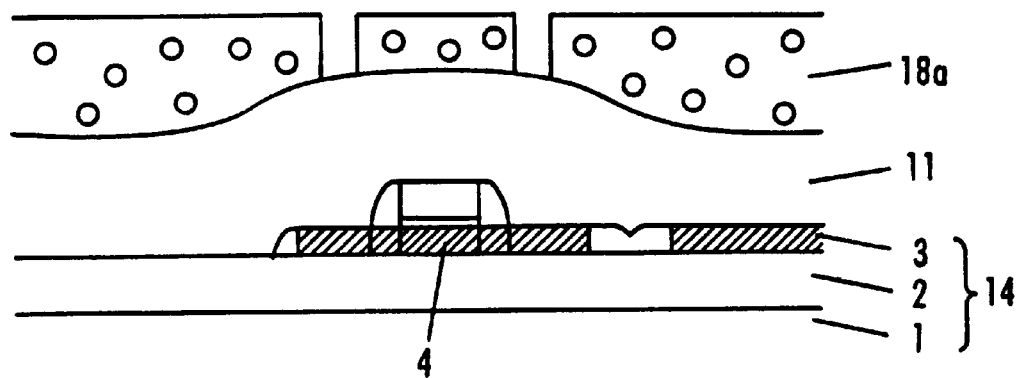
Figure 44:
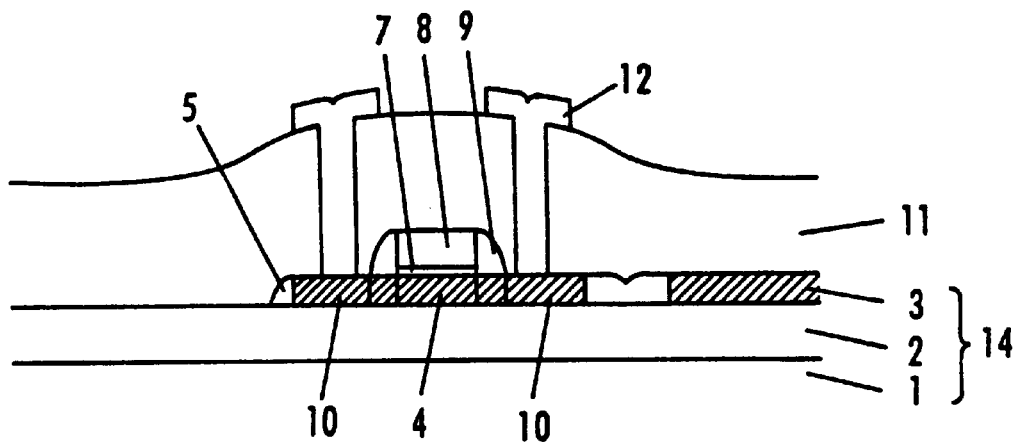
Figure 45:
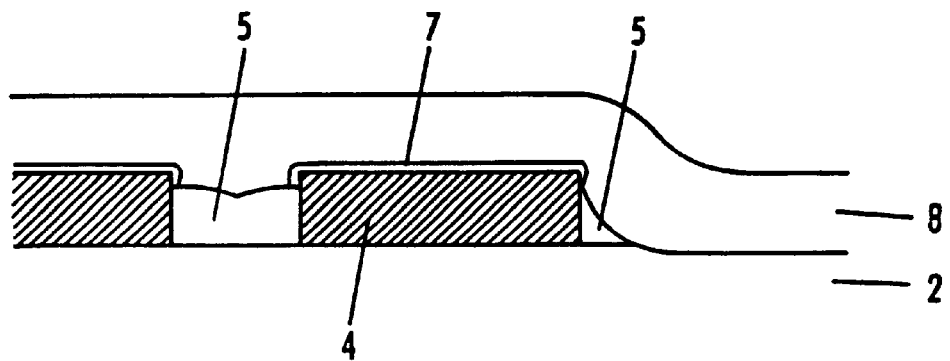
FIG. 45 illustrates a manufacturing process of a conventional SOI MOSFET, showing a cross-sectional structure of the device in the process.
Figure 46:
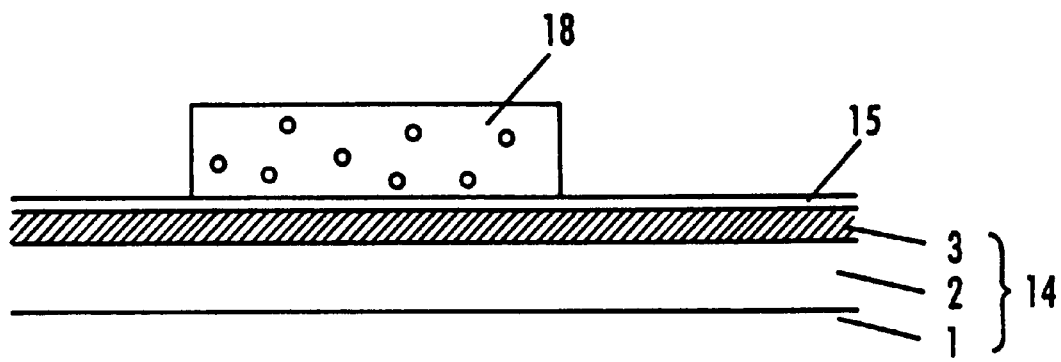
FIGS. 46–48 illustrate a manufacturing process of a conventional SOI MOSFET, showing cross-sectional structures of the device in the process.
Figure 47:
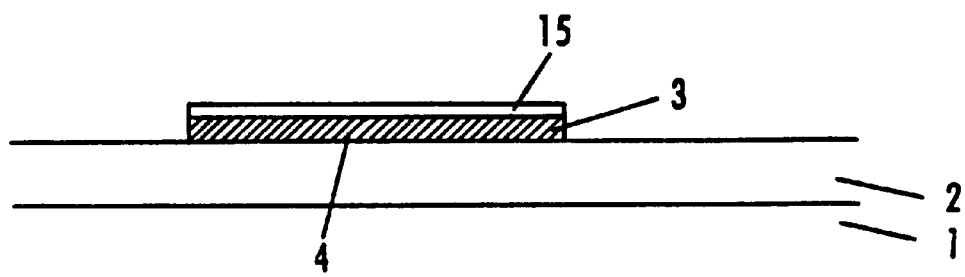
Figure 48:
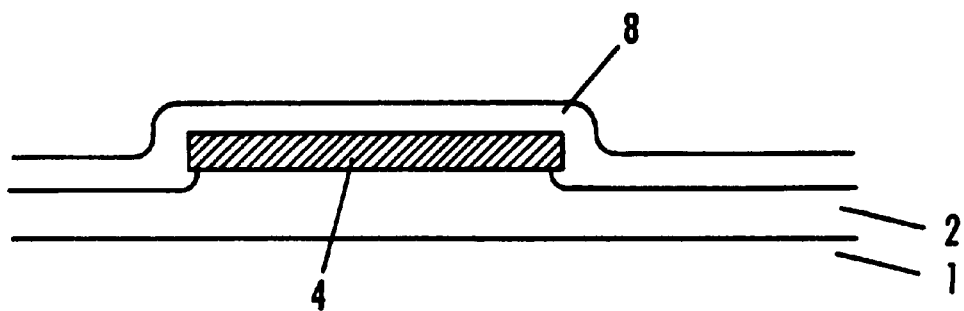
Figure 49:
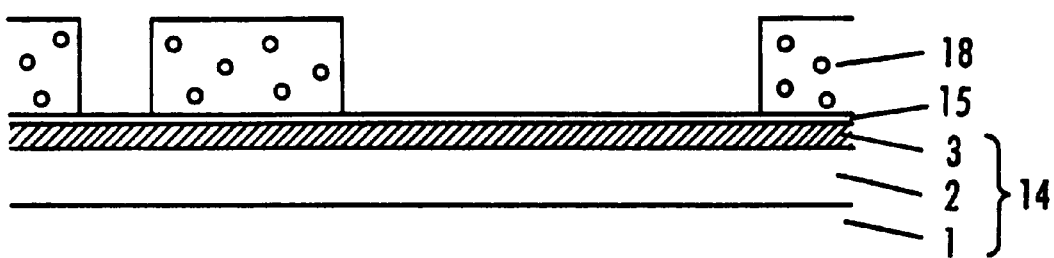
FIGS. 49–51 illustrate a manufacturing process of a conventional SOI MOSFET, showing cross-sectional structures of the device in the process (the second example)
Figure 50:
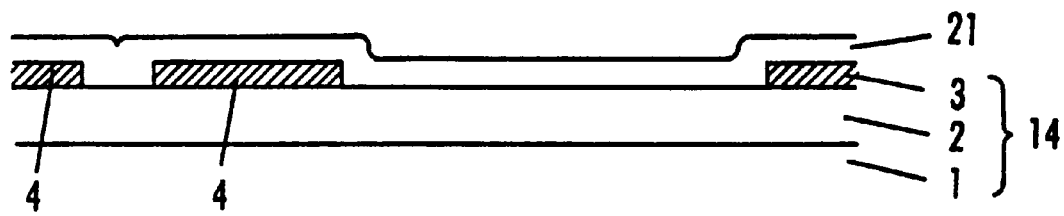
Figure 51:
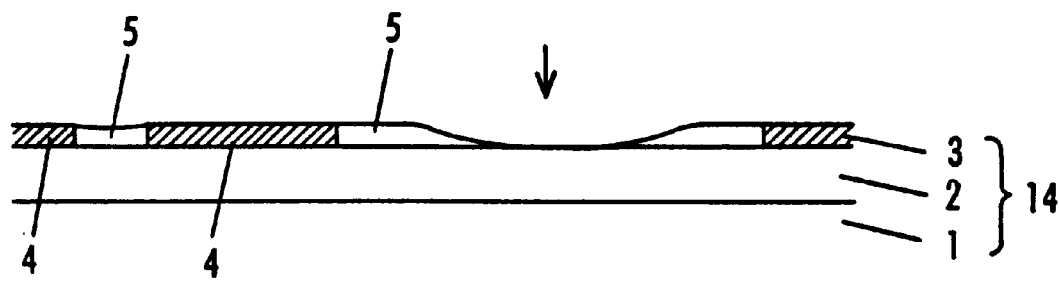
Figure 52:
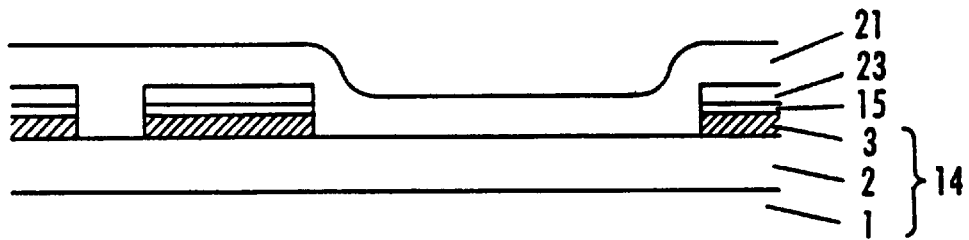
FIGS. 52–55 illustrate a manufacturing process of a conventional SOI MOSFET, showing cross-sectional structures of the device in the process (the third example)
Figure 53:
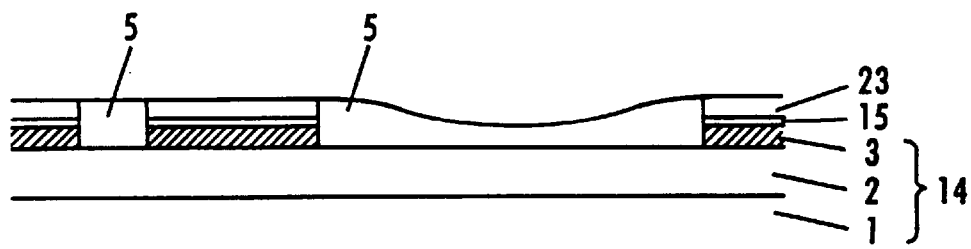
Figure 54:
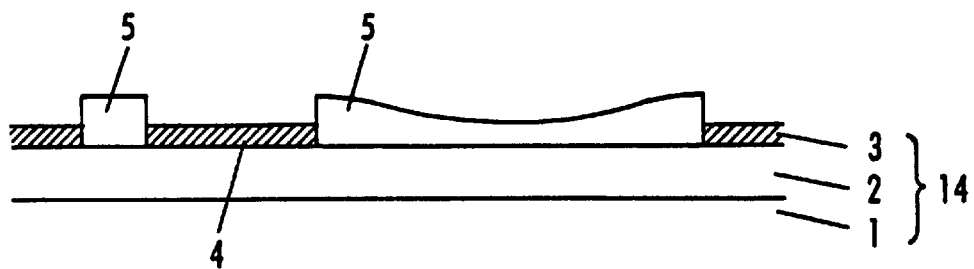
Figure 55:
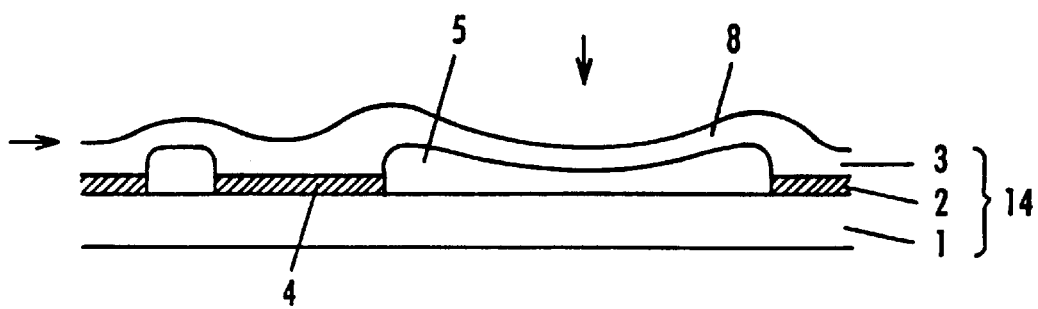
Figure 56:
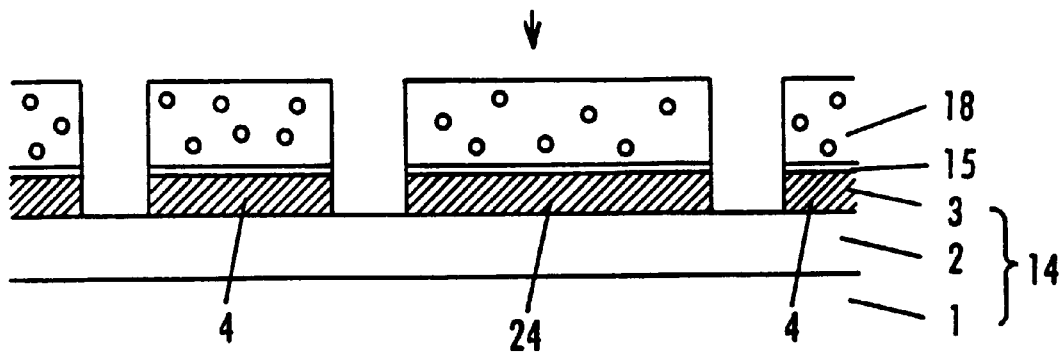
FIGS. 56–58 illustrate a manufacturing process of a conventional SOI MOSFET, showing cross-sectional structures of the device in the process (the fourth example)
Figure 57:
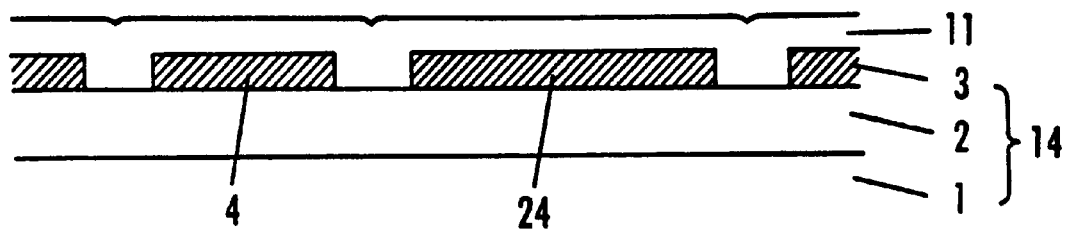
Figure 58:
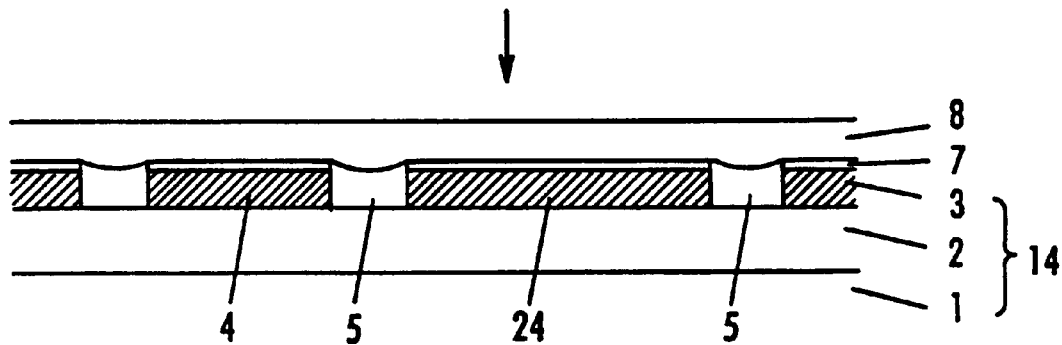
Figure 59:
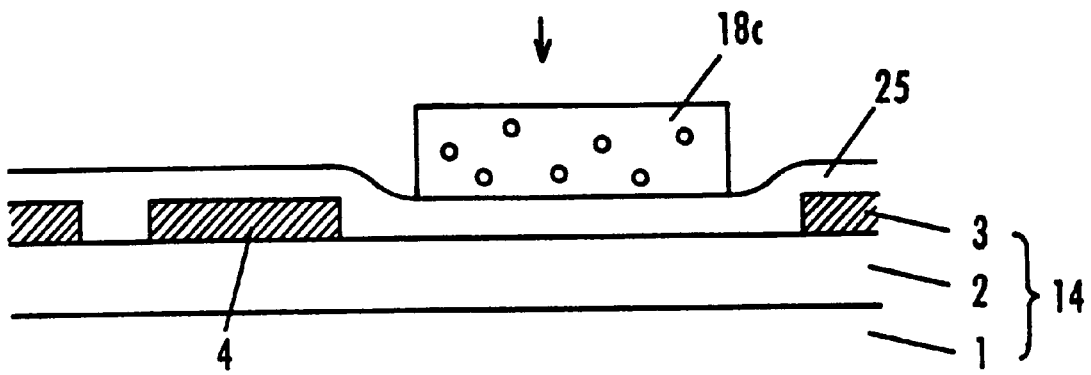
FIGS. 59–61 illustrate a manufacturing process of a conventional SOI MOSFET, showing cross-sectional structures of the device in the process (the fifth example).
Figure 60:
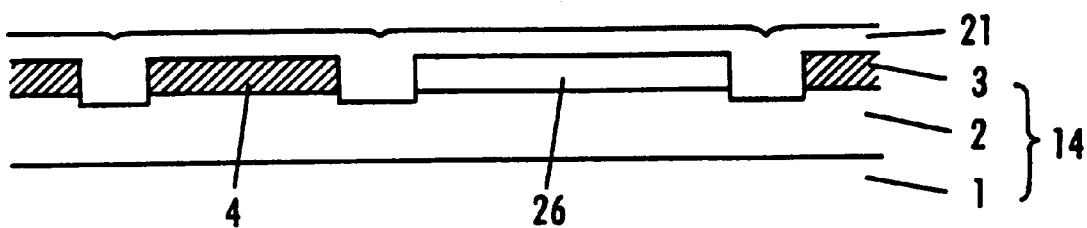
Figure 61:
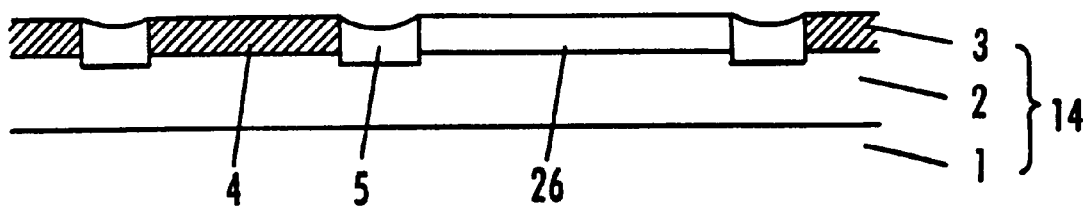

FIGS. 28 and 29 are schematic views showing a SOI semiconductor device according to the seventh embodiment of the present invention. FIG. 28 is a sectional view showing a structure of an SOI semiconductor device serving as an SOI DRAM, and in which the left half is a sectional view showing a structure of the memory cell section and the right half is a sectional view showing a structure of the peripheral circuit section. FIG. 29 is a plan view showing the memory cell of the DRAM. The sectional view taken along the line 28—28 of FIG. 29 is shown in the left half of FIG. 28.

Referring to the drawings, a plurality of SOI element forming regions 4 are formed with small distances on a buried oxide film 2 in the memory cell section. Between adjacent element forming regions 4, a buried oxide film 5 is respectively disposed. Transfer gates 8a are formed further thereon, and polysilicon storage nodes 12a, cell plates 23 (insulating film such as silicon oxide film) and polysilicon leads 12b are arranged on an interlayer insulating film 11a in the memory cell section. Another interlayer insulating film 11b is stacked, and aluminum leads 12c are arranged further thereon.

In the peripheral circuit section, on the other hand, SOI element forming regions 4 are patterned on the buried oxide film 2, surrounded by a buried oxide film 5 at the same surface level. The buried oxide film 5 is in turn contiguous to the LOCOS oxide film 6 having large thickness at an intermediate part. Either of the foregoing embodiments may be employed for this structure. Further, the interlayer insulating films 11a and 11b are stacked thereon, and aluminum lead 12 is led out.

This seventh embodiment shows an example of a semiconductor device in which each structure described in the first embodiment and the other foregoing embodiments is applied to a DRAM. Generally, in the DRAM, in the cell region formed only of NMOS, the element forming regions 4 are isolated at the minimum isolation width to minimize the chip area. On the other hand, in the peripheral region comprised of CMOS, the isolation width between PMOS and NMOS is large. Due to such a difference in pattern density, a disadvantage arises in the transistor characteristics between the peripheral section and the memory cell section. This disadvantage may be overcome by applying the structure shown in the first embodiment, or in other embodiments, to the DRAM, in order to obtain uniform characteristics. It is desirable that parasitic capacity in the peripheral circuit be reduced to as small as possible from the view point of high operation speed. In the present invention, such an advantage of reducing parasitic capacity in the peripheral circuit is achieved.

As has been described so far, in the thin film semiconductor device according to the present invention, the insulating film between the isolated element forming regions may be thickened, and therefore, parasitic capacity such as lead capacity may be reduced. The semiconductor device thus obtained is applicable to any circuit of high speed, low power consumption and low voltage which may be featured by a thin film device such as SOI type semiconductor device.

In the manufacturing process of the semiconductor device according to the present invention, it is possible to form a thin film MOSFET such as an SOI type, which is free from influence by parasitic transistor and having low leak current level between the source/drain, without increasing any mask size. And it is also possible to form an integrated circuit incorporating such a thin film MOSFET.

Further, according to the present invention, semiconductor devices of uniform characteristic may be formed irrespective of pattern density of the element forming regions.

It is further understood by those skilled in the art that the foregoing description is preferred embodiments of the invention and that various changes and modifications may be made without departing from the spirit and scope of the invention.

We claim:

1. A manufacturing process of a semiconductor device, comprising the steps of:

forming a polycrystalline semiconductor layer on a semiconductor layer which is formed on an insulating film, and further forming a nitride film on the upper surface of said polycrystalline semiconductor layer;

applying a patterned resist layer to said nitride film, patterning said nitride film and said polycrystalline semiconductor layer, and forming a nitride layer on a side surface of the patterned polycrystalline semiconductor layer;

oxidizing portion(s) of said semiconductor layer exposed by said patterning to form an oxide film;

removing said nitride layer applied to the side surface of said polycrystalline semiconductor layer, removing the exposed portion of said semiconductor layer by etching for patterning said semiconductor layer; and burying an insulating layer in spaces formed between said patterned semiconductor layer and said oxide film.

2. A manufacturing process of the semiconductor device as set forth in claim 1, wherein said nitride film formed on the upper surface of said polycrystalline semiconductor layer is removed at the same time as said nitride layer applied to the side surface of said patterned polycrystalline semiconductor layer is removed, and said polycrystalline semiconductor layer is removed by etching while said exposed portion of said semiconductor layer is removed by etching.

3. A manufacturing process of the semiconductor device as set forth in claim 1, wherein a surface of said patterned semiconductor layer is preliminarily oxidized to form an oxide film prior to burying an insulating layer in the space between said patterned semiconductor layer and said oxide film.

4. A manufacturing process of a semiconductor device, comprising the steps of:

stacking a polycrystalline semiconductor layer on a semiconductor layer formed on an insulating film, and further stacking a nitride film on the upper surface of said polycrystalline semiconductor layer;

applying a patterned resist to said nitride film, patterning said nitride film and said polycrystalline semiconductor layer, and forming a nitride layer on a side surface of the patterned polycrystalline semiconductor layer;

oxidizing the portion of said semiconductor layer exposed by said patterning to form an oxide film;

removing the nitride layer and film respectively applied to said side and upper surfaces of said polycrystalline semiconductor layer, removing the exposed portion of said semiconductor layer by etching using said polycrystalline semiconductor layer as a mask for patterning said semiconductor layer; and burying an insulating layer in the space between said patterned semiconductor layer plus polycrystalline semiconductor layer and said oxide film.

5. A manufacturing process of the semiconductor device as set forth in claim 4, wherein a dopant impurity is preliminarily introduced into a surface of the patterned semiconductor layer prior to burying an insulating film between said patterned semiconductor layer plus polycrystalline semiconductor layer and said oxide film.

6. A manufacturing process of the semiconductor device as set forth in claim 1, wherein a silicon semiconductor layer is used as said semiconductor layer, a polysilicon layer is used as said polycrystalline semiconductor layer, and either a silicon oxide film or a silicon nitride film is used as said insulating film.

7. A manufacturing process of the semiconductor device as set forth in claim 1, wherein a thickness of the nitride layer formed on the side surface of said patterned polycrystalline semiconductor layer is formed to be not larger than ½ of a distance between adjacent regions where transistors are to be formed.

8. A manufacturing process of the semiconductor device as set forth in claim 4, wherein said semiconductor layer comprises silicon, said polycrystalline semiconductor layer comprises polysilicon, and said insulating film comprises a silicon oxide or a silicon nitride.

9. A manufacturing process of the semiconductor device as set forth in claim 4, wherein a thickness of the nitride layer formed on the side surface of said patterned polycrystalline semiconductor layer is formed to be not larger than ½ of a distance between adjacent regions where transistors are to be formed.

* * * * *